US009425195B2

(12) United States Patent
Kudymov et al.

(10) Patent No.: US 9,425,195 B2
(45) Date of Patent: *Aug. 23, 2016

(54) STATIC DISCHARGE SYSTEM

(71) Applicant: Power Integrations, Inc., San Jose, CA (US)

(72) Inventors: Alexey Kudymov, Ringoes, NJ (US); Jamal Ramdani, Lambertville, NJ (US)

(73) Assignee: POWER INTEGRATIONS, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/921,161

(22) Filed: Oct. 23, 2015

(65) Prior Publication Data

US 2016/0043077 A1 Feb. 11, 2016

Related U.S. Application Data

(63) Continuation of application No. 13/537,443, filed on Jun. 29, 2012, now Pat. No. 9,245,879.

(51) Int. Cl.
*H01L 27/088* (2006.01)
*H03K 17/081* (2006.01)
*H01L 29/40* (2006.01)
*H01L 29/778* (2006.01)
*H01L 27/06* (2006.01)
*H01L 29/20* (2006.01)

(52) U.S. Cl.
CPC ........ *H01L 27/088* (2013.01); *H01L 27/0605* (2013.01); *H01L 29/404* (2013.01); *H01L 29/7786* (2013.01); *H01L 29/7787* (2013.01); *H03K 17/08104* (2013.01); *H01L 29/2003* (2013.01)

(58) Field of Classification Search
CPC .......... H01L 27/0605; H01L 27/0248; H01L 27/0266; H03K 17/08104
See application file for complete search history.

(56) References Cited

U.S. PATENT DOCUMENTS

| | | |
|---|---|---|
| 5,192,986 A | 3/1993 | Ando |
| 5,731,627 A | 3/1998 | Seok |
| 6,307,232 B1 | 10/2001 | Akiyama et al. |
| 6,507,051 B1 | 1/2003 | Hara |
| 7,525,178 B2 | 4/2009 | Kulinsky |

(Continued)

OTHER PUBLICATIONS

Koudymov, et al., "Capacitively Coupled Field Plate Grid," Jun. 20, 2011 (10 pages).

(Continued)

*Primary Examiner* — Allen Parker
*Assistant Examiner* — Stephen Bradley
(74) *Attorney, Agent, or Firm* — Stuart H. Mayer; Mayer & Williams PC

(57) ABSTRACT

A semiconductor circuit includes a three-terminal high voltage semiconductor device, a charge distribution structure and a static discharge system. The charge distribution structure has a plurality of conductors with a floating potential. The charge distribution structure is capacitively coupled to a first terminal of the semiconductor device. The static discharge system removes charge that accumulates on at least a subset of the conductors. The static discharge system removes the charge that accumulates on the subset of conductors when the semiconductor device is in a first state while allowing charge to accumulate on the subset of conductors when the semiconductor device is in a second state.

24 Claims, 10 Drawing Sheets

(56) References Cited

U.S. PATENT DOCUMENTS

| | | | |
|---|---|---|---|
| 7,777,305 B2 | 8/2010 | Kuroda et al. | |
| 8,569,842 B2 | 10/2013 | Weis et al. | |
| 9,245,879 B2* | 1/2016 | Kudymov | H01L 27/0605 |
| 2005/0161761 A1 | 7/2005 | Hatade | |
| 2008/0272443 A1 | 11/2008 | Hoshi et al. | |
| 2010/0163987 A1 | 7/2010 | Nakagawa | |
| 2011/0062495 A1 | 3/2011 | Koudymov | |
| 2011/0103148 A1 | 5/2011 | Bhalla et al. | |
| 2011/0114997 A1 | 5/2011 | Wu et al. | |
| 2011/0221011 A1 | 9/2011 | Bahat-Treidel et al. | |
| 2012/0018735 A1 | 1/2012 | Ishii | |
| 2012/0153361 A1 | 6/2012 | Ahn et al. | |
| 2012/0217544 A1 | 8/2012 | Ohki | |
| 2012/0217581 A1 | 8/2012 | Kondou | |
| 2013/0127521 A1 | 5/2013 | Simin et al. | |
| 2014/0001479 A1 | 1/2014 | Kudymov | |

OTHER PUBLICATIONS

Koudymov, Alexei, "Dynamic Model of AlGaN/GaN HFET for High Voltage Switching," Solid State Electronics, vol. 56, Issue 1, (2010), pp. 135-140 (5 pages total).

Nakajima, et al., "GaN-Based Super Heterojunction Field Effect Transistors Using the Polarization Junction Concept," IEEE Electron Device Letters, Apr. 2011 (3 pages).

International Search Report and Written Opinion mailed Oct. 2, 2013 issued in connection with corresponding International Patent Application No. PCT/US2013/048067 (10 pages total).

Nakajima, A. et al., "Novel field plate structure of AlGaN/GaN HEMTs", Physics State Solid C, vol. 4, No. 7, pp. 2736-2739 (2007). (4 pages total).

International Preliminary Report on Patentability issued Dec. 31, 2014 in connection with corresponding International Patent Application No. PCT/US2013/048067 (6 pages total) (related application 2024/7).

Pytel, Lentijo, Koudymov, Rai, Fatima, Adivarahan, Chitnis, Yang, Hudgins, Santi, Monti, Simin, Khan, "AlGaN/GaN MOSHFET integrated circuit power converter". Proceedings of IEEE Power Electronics Spec. Conference (PESC'04), pp. 579-584, 2004. (6 pages total).

Lee, Ha, Her, Lim, Seo, Han, "An AlGaN/GaN HEMT power switch employing a field plate and a floating gate", Physica Scripta, V. 126, pp. 65-67, Aug. 2006. (4 pages total).

Simin, Tipirneni, Rai, Koudymov, Adivarahan, Yang, Khan, "1.5 kV Power AlGaN/GaN HFETs'", 2005 International Semiconductor Device Research Symposium, ISDRS'2005 Abstract Book, pp. 164-165, Dec. 2005 (2 pages total).

Tipirneni, Koudymov, Adivarahan, Yang, Simin, Khan, "The 1.6 kV AlGaN/GaN HFETs", IEEE Electron Device Letters, V. 27, N9, 716-718, Sep. 2006. (3 pages total).

Simin, Hu, Ilinskaya, Kumar, Koudymov, Zhang, Khan, Gaska, Shur, "7.5kW/mm2 current switch using AlGaN/GaN metal-oxide-semiconductor heterostructure field effect transistors on SiC substrates". Electronics Letters, V. 36, No. 24, pp. 2043-2044, 2000. (2 pages total).

Anwar, Islam, and Webster, "Carrier Trapping and Current Collapse Mechanism in GaN Metal-Semiconductor Field Effect Transistors", Applied Physics Letters, V. 84, No. 11, pp. 1970-1972, Mar. 2004 (3 pages total).

Nozaki, Feick, Weber, Micovic, and Nguen, "Compression of the DC Drain Current by Electron Trapping in AlGaN/GaN Modulation Doped Field-Effect Transistors", Applied Physics Letters, V. 78, No. 19, pp. 2896-2898, May 2001 (3 pages total).

Dora, Chakraborty, McCarthy, Keller, DenBaars, Mishra, "High Breakdown Voltage Achieved on AlGaN/GaN HEMTs With Integrated Slant Field Plates", IEEE Electron Device Letters, V. 27, No. 9, pp. 713-715, Sep. 2006 (3 pages total).

Tipirneni, Adivarahan, Simin, Khan, "Silicon Dioxide-Encapsulated High Voltage AlGaN/GaN HFETs for Power-Switching Applications", IEEE Electron Device Letters, V. 28, No. 9, pp. 784-786, Sep. 2007 (3 pages total).

Saito, Nitta, Kakiuchi, Saito, Tsuda, Omura, Yamaguchi, "A 120-W Boost Converter Operation Using a High-Voltage GaN-HEMT", IEEE Electron Device Letters, V. 29, No. 1, pp. 8-10, Jan. 2008 (3 pages total).

Karmalkar and Soudabi, "A Closed-Form Model of the Drain-Voltage Dependence of the OFF-State Channel Electric Field in a HEMT with a Field Plate", IEEE Transactions on Electron Devices, V. 53, No. 10, Oct. 2006 pp. 2430-2437 (8 pages total).

Kosaka, Fujishima, Inoue, Hinoki, Yamada, Tsuchiya, Kikawa, Kamiya, Suzuki, Araki, Nanishi, "Temperature distribution analysis of AlGaN/GaN HFETs operated around breakdown voltage using micro-Raman spectroscopy and device simulation", Physica Status Solidi (c), V. 4, No. 7, pp. 2744-2747, Jun 2007 (4 pages total).

Gelmont, Shur, "Theory of Junction Between Two-Dimensional Electron Gas and p-Type Semiconductor", IEEE Transactions on Electron Devices, V. 39, No. 5, pp. 1216-1222, May 1992 (7 pages total).

Simin, Koudymov, Tarakji, Hu, Yang, Khan, Shur, Gaska. "Induced strain mechanism of current collapse in AlGaN/GaN heterostructure field-effect transistors". Applied Physics Letters, V. 79, No. 16, pp. 2651-2653, 2001 (3 pages total).

Koudymov and Shur, "Non-Ideal Current Transport in Heterostructure Field Effect Transistors", International Journal on High Speed Electronics and Systems, V. 18, No. 4, pp. 935-94 7, 2008 (10 pages total).

Koudymov, Shur, Simin, Chu, Chao, Lee, Jimenez, Balistreri, "Analytical HFET 1-V model in presence of current collapse", IEEE Transactions on Electron Devices, V. 55, N. 3, pp. 712-720, May 2008 (9 pages total).

* cited by examiner

STATIC DISCHARGE SYSTEM

CROSS-REFERENCE TO RELATED APPLICATION

This application is a continuation of U.S. patent application Ser. No. 13/537,443, filed Jun. 29, 2012, entitled, "STATIC DISCHARGE SYSTEM", incorporated by reference herein in its entirety. This application is related to copending U.S. patent application Ser. No. 13/537,407, filed Jun. 29, 2012 entitled "Switching Device with Charge Distribution Structure", incorporated by reference herein in its entirety.

BACKGROUND

This invention is related to semiconductor devices. In particular, the invention is related to heterostructure field effect transistors (HFETs) that operate as switches.

High voltage semiconductor switches are key components in electronic circuits for power conversion. Examples of these applications include power supplies for electronic equipment, drives for electric motors, and inverters for solar cells.

A power switch has an on state that allows the device to conduct current, and an off state that prevents the device from conducting current. When in the on state, a power switch may conduct tens or hundreds of amperes while the voltage across the switch is less than one volt. When in the off state, the power switch typically must withstand hundreds or thousands of volts while conducting substantially zero current. The voltage that the device can withstand in the off state while conducting no more than a given small value of current is sometimes referred to as the breakdown voltage.

High voltage HFETs are fabricated to have, among other properties, a breakdown voltage that is predictable and stable. The fabrication of high voltage HFETs may include special structures of conductive components surrounded by an electrically insulating material. Such insulated conductors are sometimes called floating conductors because their electric potentials do not have a well-controlled relationship to a reference electric potential value under static conditions. The floating conductors may change their potentials in a controlled way under dynamic conditions.

Capacitive coupling between the conductive components within the electrically insulating material may allow the net total electric charges to distribute more or less uniformly within a region of the device in response to rapid changes in voltage at the terminals of the device. The distribution of charge during voltage transitions may prevent high local electric fields that can reduce the breakdown voltage. Use of charge distribution structures may also allow designers of the device to make accurate predictions of breakdown voltage before fabrication.

A perfect insulating material surrounding the conductive components of the charge distribution structure would prevent the conductive components from acquiring a static charge from the environment. Electric currents leaking through an imperfect insulating material can cause charge to accumulate on the conductive components of the charge distribution structure.

Electric fields from accumulated static charge can interfere with the ability of the charge distribution structure to prevent the high dynamic electric fields that reduce the breakdown voltage of the device. Since the accumulated static charge is the result of past electrical stress on the device, the breakdown voltage may depend on the device's history.

A solution is required to prevent the accumulation of static electric charge on floating conductors in semiconductor devices.

BRIEF DESCRIPTION OF THE FIGURES

Non-limiting and non-exhaustive embodiments of the present invention are described with reference to the following figures, wherein like reference numerals refer to like parts throughout the various views unless otherwise specified.

DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

The present invention includes a network of transistors that is coupled to the conductors in a charge distribution structure of a semiconductor device. The transistors of the network allow electric charge to accumulate on the conductors when the semiconductor device is in an off state, and the transistors automatically reduce the accumulated charge on the conductors when the semiconductor is in an on state.

Figure 1:
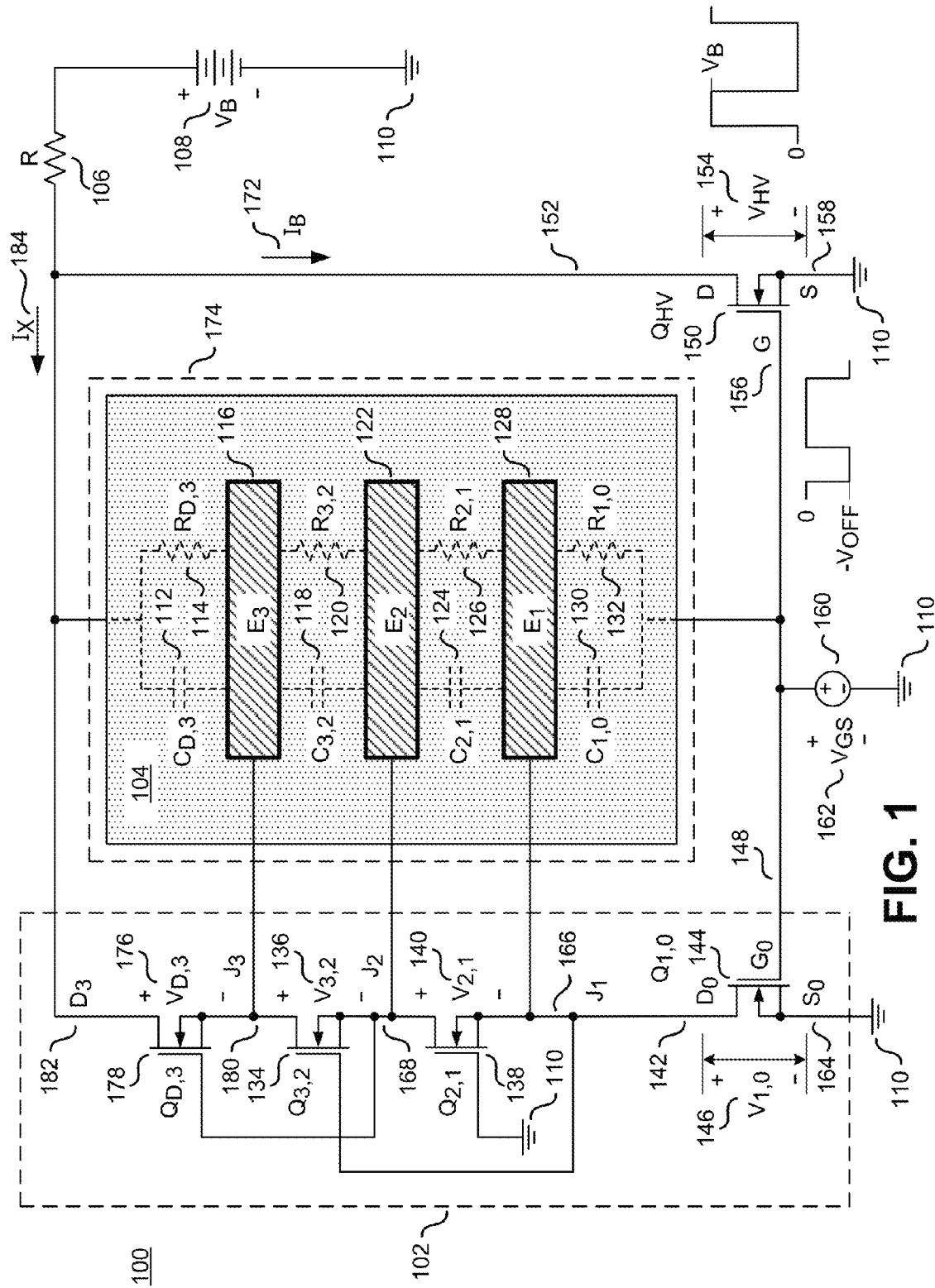
FIG. 1 is an electrical schematic that shows an equivalent circuit of an example static discharge system in accordance with the teaching of the present invention.

FIG. 1 is electrical schematic diagram 100 that shows an equivalent circuit of an example static discharge system 102 in accordance with the teaching of the present invention. In the circuit of FIG. 1, transistor $Q_{HV}$ 150 is a high voltage HFET that includes components of an internal capacitively-coupled charge distribution structure 174. Transistor $Q_{HV}$ 150 is an HFET with a drain terminal 152, a gate terminal 156, and a source terminal 158.

The internal capacitively-coupled charge distribution structure 174 of high voltage HFET $Q_{HV}$ 150 is represented by conductive components $E_1$ 128, $E_2$ 122, and $E_3$ 116 that are surrounded by an electrically insulating material 104. An example physical construction of an example high voltage HFET that includes a charge distribution structure is presented later in this disclosure.

FIG. 1 shows capacitors with dashed lines within the electrically insulating material 104 to represent capacitance between the individual components of the charge distribution structure 174 and between those components and other parts of the transistor $Q_{HV}$ 150. It is appreciated that capacitance exists between every pair of objects that can possess an electric charge. The representation in FIG. 1 highlights the capacitance that is discharged by the static discharge system 102 according to the teachings of the present invention.

Capacitance $C_{D,3}$ 112 represents the capacitive coupling between the drain terminal 152 of transistor $Q_{HV}$ 150 and component $E_3$ 116. Capacitance $C_{3,2}$ 118 represents the capacitive coupling between component $E_3$ 116 and component $E_2$ 122. Capacitance $C_{2,1}$ 124 represents the capacitive coupling between component $E_2$ 122 and component $E_1$ 128. Capacitance $C_{1,0}$ represents the capacitive coupling between component $E_1$ and the gate terminal 156 of transistor $Q_{HV}$ 150.

FIG. 1 also shows resistors with dashed lines within the insulating material 104 to represent the finite resistance that exists between the individual components of the charge distribution structure 174 and between those components and other parts of the transistor $Q_{HV}$ 150. Since electrical insulating material 104 is imperfect, electric charge is able to move within the material in response to electric fields that correspond to difference in voltage. The movement of charge between conductors within the insulating material in response to a difference in voltage between conductors is sometimes referred to as leakage current.

Resistor $R_{D,3}$ 114 represents the resistance between the drain terminal 152 of transistor $Q_{HV}$ 150 and component $E_3$ 116 of the charge distribution structure 174. Resistor $R_{3,2}$ 120 represents the resistance between component $E_3$ 116 and component $E_2$ 122 of the charge distribution structure 174. Resistor $R_{2,1}$ 126 represents the resistance between component $E_2$ 122 and component $E_1$ 128 of the charge distribution structure 174. Resistor $R_{1,0}$ represents the resistance between component $E_1$ 128 and the gate terminal 156 of transistor $Q_{HV}$ 150. The value of the resistance between conductive components of the charge distribution structure 174 and the terminals of the transistor $Q_{HV}$ 150 is determined by the resistivity of the insulating material 104 and by the physical separation between the conducting components and the terminals.

Transistor $Q_{HV}$ 150 in the example of FIG. 1 operates as a switch in a circuit that includes a constant voltage source $V_B$ 108 and a resistor R 106. In typical applications, voltage source $V_B$ may have a value of several hundred volts. In the example of FIG. 1, voltage source $V_B$ 106 has a negative terminal coupled to a common return 110 and a positive terminal coupled to one end of resistor 106. The other end of resistor 106 is coupled to the drain terminal 152 of transistor $Q_{HV}$ 150. The source terminal 158 of transistor $Q_{HV}$ 150 is coupled to the common return 110. In the example of FIG. 1, a variable voltage source 160 that produces a switching control voltage $V_{GS}$ 162 is coupled between the gate terminal 156 and the common return 110.

When transistor $Q_{HV}$ 150 in the example of FIG. 1 is switched on, transistor $Q_{HV}$ 150 conducts a current $I_B$ 172 through resistor 106 from constant voltage source 108, and the voltage $V_{HV}$ 154 between the drain terminal 152 and the source terminal 158 is much less than the voltage of constant voltage source $V_B$ 108. The voltage $V_{HV}$ 154 between the drain terminal 152 and the source terminal 158 is typically less than 5 volts when transistor $Q_{HV}$ is switched on. When transistor $Q_{HV}$ 150 is switched off, there is substantially zero current in resistor 106, and the voltage $V_{HV}$ 154 between the drain terminal 152 and the source terminal 158 is substantially the value of the constant voltage source $V_B$ 108. Therefore, in a typical application the voltage $V_{HV}$ 154 may switch between a few volts and several hundred volts.

Transistor $Q_{HV}$ 150 in the example of FIG. 1 is known as a depletion mode device because it requires a non-zero voltage on the gate terminal 156 with respect to the source terminal 158 to stop conduction of drain current $I_B$ 172. The normal state of a transistor is generally considered to be a state with no signal between the gate and the source. That is, a depletion mode device is considered to be normally on because it may conduct current when it has zero volts between gate and source. Depletion mode HFET devices require a negative voltage that is more negative than a threshold value between gate and source to stop conduction of drain current $I_B$ 172. A positive voltage between gate and source as well as zero voltage between gate and source will allow a depletion mode device to conduct. In the example of FIG. 1, switching control voltage 162 switches to a negative value $-V_{OFF}$ that is more negative than the threshold voltage of transistor $Q_{HV}$ 150 to switch transistor $Q_{HV}$ 150 off Conventional HFET devices are depletion mode devices.

When transistor $Q_{HV}$ 150 is off and voltage $V_{HV}$ 154 is high, conductive components $E_3$ 116, $E_2$ 122, and $E_1$ 128 of the charge distribution structure 174 may accumulate a static charge from leakage currents in the electrically insulating material 104. The magnitude of the static charge that may accumulate without a static discharge system is influenced by the capacitance and the electrical resistance between the individual conductors, as well as by the average voltage that appears between the drain 152 and the gate 156 of transistor $Q_{HV}$ 150. Electric fields that result from the accumulated static charge may reduce the breakdown voltage of transistor $Q_{HV}$ 150. In the absence of a static discharge system, the accumulated charge may remain in the device for a time that may range from minutes to days. The static discharge system 102 shown in FIG. 1 may reduce the accumulated charge to negligible levels every time transistor $Q_{HV}$ 150 turns on.

The circuit of the example static discharge system 102 in FIG. 1 includes transistors $Q_{D,3}$ 178, $Q_{3,2}$ 134, $Q_{2,1}$ 138, and $Q_{1,0}$ 144. All transistors in FIG. 1 are depletion mode HFET devices. The transistors in the static discharge system 102 may have substantially lower breakdown voltages than high voltage transistor $Q_{HV}$ 150 because resistors $R_{D,3}$ 114, $R_{3,2}$ 120, $R_{2,1}$ 126 and $R_{1,0}$ 132 form a voltage divider circuit that allows only a fraction of the high voltage $V_{HV}$ 154 to appear across any transistor in the static discharge system 102. As such, the transistors in the static discharge system 102 do not require charge distribution structures. Therefore, the low voltage transistors in the static discharge system 102 and the high voltage power transistor $Q_{HV}$ 150 may be fabricated together on the same semiconductor wafer, with only transistor $Q_{HV}$ 150 having a charge distribution structure.

FIG. 1 shows that the gate $G_0$ 148 of transistor $Q_{1,0}$ 144 in the static discharge system 102 is coupled directly to the gate G 156 of high voltage transistor $Q_{HV}$ 150, and the source $S_0$ 164 of transistor $Q_{1,0}$ 144 is coupled to the source S 158 of high voltage transistor $Q_{HV}$ 150 through the common return 110. Since transistors $Q_{1,0}$ 144 and $Q_{HV}$ 150 are both depletion mode HFET devices with approximately the same threshold voltages, both transistors turn on and turn off at the same time.

When transistors $Q_{HV}$ 150 and $Q_{1,0}$ 144 in the example of FIG. 1 turn on, all transistors turn on, and the drain-to-source voltages $V_{HV}$ 154, $V_{1,0}$ 146, $V_{2,1}$ 140, $V_{3,2}$ 136, and $V_{D,3}$ 176 will be typically less than five volts. Since transistor $Q_{HV}$ 150 is substantially larger than the transistors in the static discharge structure 102, transistor $Q_{HV}$ 150 conducts nearly all the current in resistor R 106. In other words, current Ix 184 that goes to the charge distribution structure 174 and to the static discharge system 102 is negligible in comparison to the current $I_B$ 172 in transistor $Q_{HV}$ 150.

The drain terminal $D_0$ 142 of transistor $Q_{1,0}$ 144 is coupled to conductive component $E_1$ 128 of the charge distribution structure 174. Since voltage $V_{HV}$ 154 will be typically less than five volts when transistor $Q_{1,0}$ 144 is on, $V_{1,0}$ will be typically between zero and five volts when transistor $Q_{1,0}$ 144 is on. Therefore, when transistor $Q_{1,0}$ 144 turns on, static charge on conductive component $E_1$ 128 of the charge distribution structure 174 is discharged to the common return 110, and the voltage on the capacitance $C_{1,0}$ 130 is reduced to typically much less than five volts.

FIG. 1 shows transistor $Q_{2,1}$ 138 coupled between conductive components $E_2$ 122 and $E_1$ 128 of the charge distribution structure 174. The voltage between conductive components $E_2$ 122 and $E_1$ 128 is the drain-to-source voltage $V_{2,1}$ 140 of transistor $Q_{2,1}$ 138. The gate terminal of transistor $Q_{2,1}$ 138 is coupled to the common return 110. The source terminal of transistor $Q_{2,1}$ 138 is coupled to the drain terminal of transistor $Q_{1,0}$ 144, and to the gate terminal of transistor $Q_{3,2}$ 134, and to the conductive component $E_1$ 128 at a junction $J_1$ 166. As used in this disclosure, a junction is an electrical termination that is both a source terminal of a transistor and a drain terminal of a different transistor.

FIG. 1 also shows transistor $Q_{3,2}$ 134 coupled between conductive components $E_3$ 116 and $E_2$ 122 of charge distribution structure 174. The drain terminal of transistor $Q_{3,2}$ 134 is coupled to conductive component $E_3$ 116 of charge distribution structure 174 and to the source terminal of transistor $Q_{D,3}$ 178 at a junction $J_3$ 180. The source terminal of transistor $Q_{3,2}$ 134 is coupled to the drain terminal of transistor $Q_{2,1}$ 138, and to the gate terminal of transistor $Q_{D,3}$ 178, and to conductive component $E_2$ 122 of charge distribution structure 174 at a junction $J_2$ 168. The voltage between conductive components $E_3$ 116 and $E_2$ 122 of charge distribution structure 174 is the drain-to-source voltage $V_{3,2}$ 136 of transistor $Q_{3,2}$ 134. The gate terminal of transistor $Q_{3,2}$ 134 is coupled to the conductive component $E_1$ 128 of charge distribution structure 174, and to the source terminal of transistor $Q_{2,1}$ 138, and to the drain terminal of transistor $Q_{1,0}$ 144 at junction $J_1$ 166.

The example of FIG. 1 shows transistor $Q_{D,3}$ 178 coupled between the drain terminal 152 of transistor $Q_{HV}$ 150 and conductive component $E_3$ 116 of charge distribution structure 174. The voltage between the drain terminal 152 of transistor $Q_{HV}$ 150 and conductive component $E_3$ 116 of charge distribution structure 174 is the drain-to-source voltage $V_{D,3}$ 176 of transistor $Q_{D,3}$ 178. The drain terminal of transistor $Q_{D,3}$ 178 is coupled to the drain terminal 152 transistor $Q_{HV}$ 150. The source terminal of transistor $Q_{D,3}$ 178 is coupled to the conductive component $E_3$ 116 of the charge distribution structure 174 and to the drain terminal of transistor $Q_{3,2}$ 134 at the junction $J_3$ 180. The gate terminal of transistor $Q_{D,3}$ 178 is coupled to the conductive component $E_2$ 122 of charge distribution structure 174, and to the source terminal of transistor $Q_{3,2}$ 134, and to the drain terminal of transistor $Q_{2,1}$ 138 at the junction $J_2$ 168.

When transistor $Q_{1,0}$ 144 turns on to discharge capacitance $C_{1,0}$ 130 associated with conductive component $E_1$ 128, transistors $Q_{2,1}$ 138 and $Q_{3,2}$ 134 and $Q_{D,3}$ 178 also turn on to discharge capacitances $C_{2,1}$ 124, $C_{3,2}$ 118, and $C_{D,3}$ 112 associated with the respective conductive components $E_2$ 122 and $E_3$ 116. Therefore, when high voltage transistor $Q_{HV}$ 150 turns on, transistors of the static discharge system 102 set the voltages on the conductive components of the charge distribution structure 174 to approximately the potential of the common return 110, effectively removing accumulated static charge from the conductive components of the charge distribution structure 174.

When transistors $Q_{HV}$ 150 and $Q_{1,0}$ 144 turn off and the voltage $V_{HV}$ 154 increases, the voltages on the conductive components $E_1$ 128, $E_2$ 122, and $E_3$ 116 of charge distribution structure 174 will increase to reach or exceed a magnitude that turns off transistors $Q_{2,1}$ 138, $Q_{3,2}$ 134, and $Q_{D,3}$ 178. The voltage on conductive components $E_1$ 128, $E_2$ 122, and $E_3$ 116 of charge distribution structure 174 is limited to a fraction of the voltage $V_{HV}$ 154 as determined by the voltage divider circuit formed by the resistors $R_{D,3}$ 114, $R_{3,2}$ 120, $R_{2,1}$ 126, and $R_{1,0}$ 132 and/or capacitances $C_{2,1}$ 124, $C_{3,2}$ 118, and $C_{D,3}$ 112.

In a typical design, when transistor $Q_{HV}$ 150 is off and $V_{HV}$ 154 is hundreds of volts, the voltage between any two adjacent conductive components of the charge distribution structure 174, will be between 10 and 200 volts. At the same time, the voltage between conductive component $E_1$ 128 of charge distribution structure 174 and the gate 156 of transistor $Q_{HV}$ 150, will also be between 10 and 200 volts. In other words, the voltages $V_{D,3}$ 176, $V_{3,2}$ 136, $V_{2,1}$ 140, and $V_{1,0}$ 146 when transistor $Q_{HV}$ 150 is off will be sufficient to turn off transistors $Q_{D,3}$ 178 and $Q_{3,2}$ 134 and $Q_{2,1}$ 138. Therefore, when high voltage is present between the drain terminal 152 and the source terminal 158 of high voltage transistor $Q_{HV}$ 150, all transistors in the static discharge system 102 will be off, providing minimum leakage current through the discharge system 102 and, therefore, minimum voltage drop across the load resistor R 106.

In other words, depletion mode devices in the static discharge system of the present invention are coupled to floating conductors of a charge distribution structure included in a semiconductor device. When the semiconductor device is on, the difference in voltage between the floating conductors is sufficiently low to turn on the depletion mode devices. When the semiconductor device is off, the difference in voltage between the floating conductors is sufficiently high to turn off the depletion mode devices.

Figure 2:
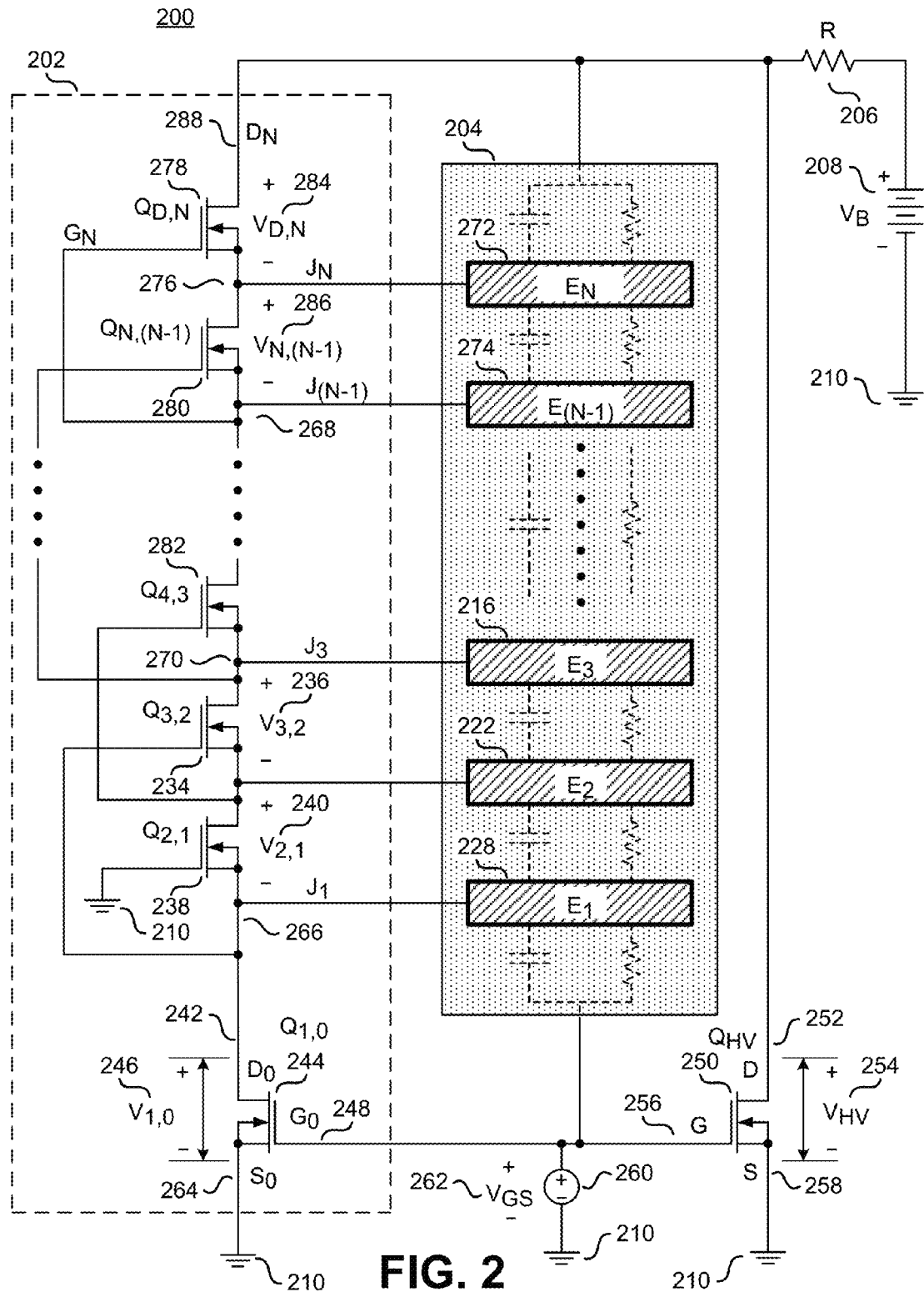
FIG. 2 is an electrical schematic that shows an equivalent circuit illustrating the general configuration of an example static discharge system accordance with the teachings of the present invention.

FIG. 2 is an electrical schematic diagram 200 that shows how the example static discharge system of FIG. 1 may be expanded to accommodate a general charge distribution system that has N elements. In the example of FIG. 2, transistor $Q_{HV}$ 250 is a high voltage HFET with a drain terminal 252, a source terminal 258, and a gate terminal 256. An internal charge distribution structure between the drain terminal 252 and the gate terminal 256 of transistor $Q_{HV}$ 250 includes conductive components $E_1$ 228, $E_2$ 222, $E_3$ 216, $E_{(N-1)}$ 274, and $E_N$ 272 surrounded by an imperfect electrically insulating material 204.

In the general example of FIG. 2, the drain terminal D 252 of high voltage HFET $Q_{HV}$ 250 is coupled to one end of a resistor R 206 and to the drain $D_N$ 288 of a transistor $Q_{D,N}$ 278 in a static discharge system 202. The other end resistor R 206 is coupled to the positive terminal of a constant voltage source $V_B$ 208. The negative terminal of the constant voltage source $V_B$ 208 is coupled to a common return 210. The source terminal S 258 of high voltage HFET $Q_{HV}$ 250 is also coupled to the common return 210. A variable voltage source 260 that produces a switching control voltage $V_{GS}$ 262 is coupled between the gate terminal G 256 of high voltage HFET $Q_{HV}$ 250 and the common return 210. As in the example of FIG. 1, high voltage HFET $Q_{HV}$ 250 operates as a switch that produces a switching voltage $V_{HV}$ 254 between the drain terminal 242 and the source terminal 258.

The general example of FIG. 2 also shows the static discharge system 202 that includes transistors $Q_{1,0}$ 244, $Q_{2,1}$ 238, $Q_{3,2}$ 234, $Q_{4,3}$ 282, $Q_{N,(N-1)}$ 280, and $Q_{D,N}$ 278. As in the example of FIG. 1, all transistors in the general example of FIG. 2 are depletion mode HFETs.

Transistor $Q_{1,0}$ 244 in the static discharge system of FIG. 2 has a gate terminal G 248 coupled to the gate terminal 256 of high voltage transistor $Q_{HV}$ 250. Transistor $Q_{1,0}$ has a source terminal $S_0$ 264 coupled to common return 210. Drain terminal $D_0$ 242 of transistor $Q_{1,0}$ 244 is coupled at a junction $J_1$ 266 to the source terminal of transistor $Q_{2,1}$ 238 and to the gate terminal of transistor $Q_{3,2}$ 234, and to the conductive component $E_1$ 228. The gate terminal of transistor $Q_{2,1}$ 238 is coupled to the common return 210. The drain terminal of transistor $Q_{2,1}$ 238 is coupled to the source terminal of transistor $Q_{3,2}$ 234, to the gate terminal of transistor $Q_{4,3}$ 282, and to the conductive component $E_2$ 222.

The voltage between conductive component $E_1$ 228 and the common return 210 is the voltage $V_{1,0}$ 246 between the drain terminal $D_0$ 244 and the source terminal $S_0$ 264 of transistor 244. The voltage between conductive components $E_2$ 222 and $E_1$ 228 is the voltage $V_{2,1}$ 240 between the drain terminal and the source terminal of transistor $Q_{2,1}$ 238. The voltage between conductive components $E_3$ 216 and $E_2$ 222 is the voltage $V_{3,2}$ 236 between the drain terminal and the source terminal of transistor $Q_{3,2}$ 234.

The general example of FIG. 2 shows the drain terminal $D_N$ 288 of transistor $Q_{D,N}$ 278 coupled to the drain terminal D 252 of high voltage HFET $Q_{HV}$ 250. The source terminal of transistor $Q_{D,N}$ 278 in the general example of FIG. 2 is coupled to conductive component $E_N$ 272 and to the drain terminal of transistor $Q_{N,(N-1)}$ 280 at a junction $J_N$ 276. The source terminal of transistor $Q_{N,(N-1)}$ 280 is coupled to conductive component $E_{(N-1)}$ 274 and to the gate terminal of transistor $Q_{D,N}$ 278 at a junction $J_{(N-1)}$ 268. The voltage between conductive components $E_N$ 272 and $E_{(N-1)}$ 274 is the voltage $V_{N,(N-1)}$ 286. The voltage between the drain D 252 of transistor $Q_{HV}$ 250 and conductive component $E_N$ 272 is $V_{D,N}$ 284.

FIG. 2 shows that the static discharge system 202 may be applied to a charge distribution structure that is part of a high voltage HFET, the charge distribution structure having N conductive components designated as $E_1$ through $E_N$ with conductive component $E_1$ nearest the gate terminal of the HFET and conductive component $E_N$ nearest the drain terminal of the HFET. For non-trivial examples where N>1, the conductive components may be arranged so that for any two conductive components $E_K$ and $E_{E(K-1)}$, the conductive component $E_K$ is nearer to the drain terminal of the high voltage HFET than the conductive component $E_{(K-1)}$, where K is an integer greater than one and less than or equal to N. Stated symbolically, in the preceding description K is an integer with 1<K≤N.

FIG. 2 also shows that low voltage HFETs of the static discharge system 202 may be coupled between the conductive components of the charge distribution structure to realize a circuit that has the drain terminal of a low voltage HFET $Q_{K,(K-1)}$ coupled to conductive component $E_K$, and the source terminal of the low voltage HFET $Q_{K,(K-1)}$ coupled to conductive component $E_{(K-1)}$ at a junction $J_{(K-1)}$. The circuit further has the gate terminal of the low voltage HFET $Q_{K,(K-1)}$ coupled to the junction $J_{(K-2)}$. For the special case of K=2, the circuit has the gate terminal of HFET $Q_{K,(K-1)}$ coupled to the source terminal of the high voltage HFET. The general static discharge structure of FIG. 2 shows that a low voltage HFET $Q_{D,N}$ may be coupled between the drain terminal of the high voltage HFET and the conductive component $E_N$ of the static discharge system.

FIG. 2 also shows that the general example circuit of a static discharge system 202 includes an additional low voltage HFET coupled with its drain terminal to conductive component $E_1$, its source terminal coupled to the source terminal of the high voltage HFET, and its gate terminal coupled to the gate terminal of the high voltage HFET. Thus as illustrated by the general example of FIG. 2, a static discharge system for a high voltage HFET may include one low voltage HFET for every conductive component of a charge distribution structure that is part of the high voltage HFET. For the trivial case of only a single conductive component in the charge distribution structure (N=1 and K=0), the static discharge system reduces to the single transistor $Q_{1,0}$ 244.

Therefore, FIG. 2 shows an example of a semiconductor circuit comprising a three terminal semiconductor device 250, a surface charge distribution structure 204 having a plurality of conductors with a floating potential (228, 222, 216, 274, and 272), being capacitively coupled to a terminal of the semiconductor device, and a static discharge system 202 for removing charge that accumulates on the conductors when the semiconductor device is in a first (off) state while allowing charge to accumulate on the conductors when the semiconductor device is in a second (on) state.

It will be appreciated by those skilled in the art that the difference in voltage between the conductive components of the charge distribution structure 204 when the high voltage transistor $Q_{HV}$ 250 is off depends on the number N of conductive components and the relative spacing between the conductive components. The voltage between adjacent conductive components may be reduced with larger N and reduced spacing. In examples where the voltage between adjacent conductive components of the charge distribution structure 204 is not large enough to turn off the transistors of the static discharge system 202, the gates of the low voltage HFETs may be coupled to conductive components that are farther away from the sources of their respective HFETs. In other words, the gate terminal of a low voltage HFET $Q_{K,(K-1)}$ may be coupled to a junction $J_{(K-2-M)}$ where M is an integer greater than equal to one.

The transistors of the static discharge system may be fabricated using the same process as the semiconductor device that includes the charge distribution system. Moreover, the static discharge system may be fabricated on the same substrate as the semiconductor device that includes the charge distribution system and simultaneously with the semiconductor device that includes the charge distribution system.

Figure 3:
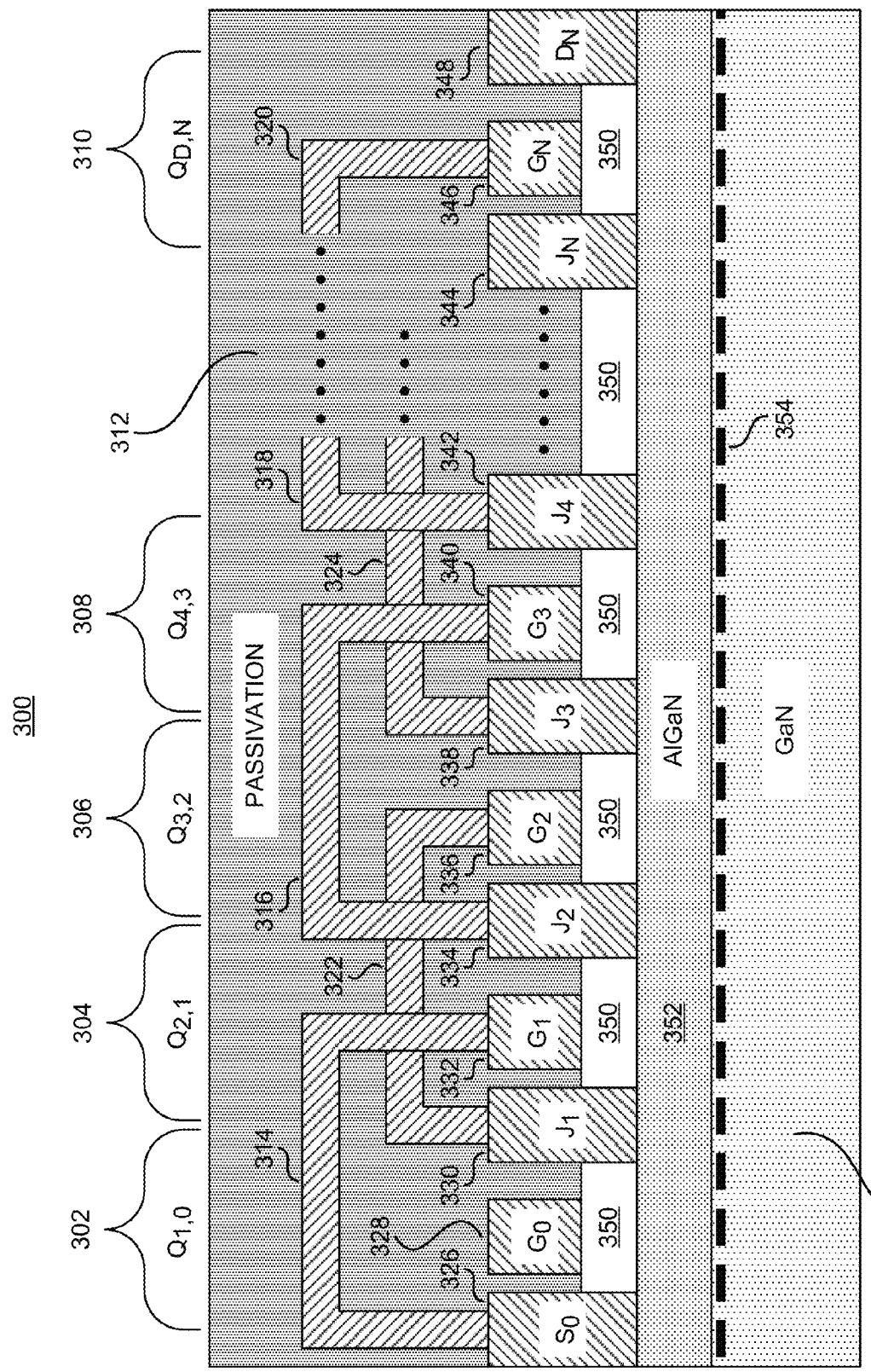
FIG. 3 is a cross section of a semiconductor structure that shows transistors of an example static discharge system in accordance with the teachings of the present invention.

FIG. 3 shows the salient features of a general example of a static discharge system in accordance with the teachings of the present invention. In particular, FIG. 3, which is not drawn to scale, is a cross-sectional view 300 through one part of a static discharge system that includes several heterostructure field effect transistors (HFETs). The schematic diagram of the static discharge system 202 of FIG. 2 is representative of the cross section of the semiconductor construction illustrated in FIG. 3.

The example static discharge system illustrated in FIG. 3 comprises a first active layer 356 and a second active layer 352. The first active layer 356 is typically disposed over a substrate (not shown in FIG. 3) that may be formed from various materials such as sapphire ($Al_2O_3$), silicon (Si), or silicon carbide (SiC) as is known in the art. Various techniques of fabrication may call for layers of other materials to be disposed between the substrate and the first active layer 356 to facilitate the construction of the device.

The first active layer 356 in the example of FIG. 1 is comprised of gallium nitride (GaN). In other examples, different semiconductor materials containing nitride compounds of other elements from Group III of the Periodic Table of the Elements may comprise the first active layer 356.

The second active layer 352 in the example of FIG. 3 is comprised of aluminum gallium nitride (AlGaN). In other examples, different Group III nitride semiconductor materials such aluminum indium nitride (AlInN) and aluminum indium gallium nitride (AlInGaN) may comprise the second active layer 352. The material of the second active layer 352 may be a non-stoichiometric compound. In such materials, the ratios of the elements are not easily represented by ordinary whole numbers. For example, the second active layer 352 may be a non-stoichiometric compound of a Group III nitride semiconductor material such as $Al_xGa_{1-x}N$ where 0<X<1.

In the example of FIG. 3, a conductive source contact 326, a conductive drain contact 348, and conductive gate contacts 328, 332, 336, 340, and 346 are disposed over the second active layer 352. Also disposed over the second active layer 352 are conductive junction contacts 330, 334, 338, 342, and 344. As used in this disclosure, a junction contact joins the source contact of a transistor to the drain contract of a neighboring transistor.

Also in the example of FIG. 3, a gate dielectric layer 350 separates the gate contacts 328, 332, 336, 340, and 346 from the second active layer 352. A dielectric is an electrically insulating material that can be polarized by an external electric field. Polarization orients bound electric charge in the material to make the magnitude of the electric field inside the material less than the magnitude of the external electric field.

The source, gate, junction, and drain contacts shown in the example of FIG. 3 are parts of several individual transistors of a static discharge structure 202 as described in the electrical schematic of the general example of FIG. 2. The source $S_0$ 326, the gate $G_0$ 328, and junction $J_1$ 330 are respectively source, gate, and drain terminals of HFET $Q_{1,0}$ 302. Similarly, junction contact $J_1$ 330, gate contact $G_1$ 332, and junction contact $J_2$ 334 are respectively the source, gate and drain terminals of HFET $Q_{2,1}$ 304. Junction contacts $J_2$ 324, $J_3$ 338, $J_4$ 342, and $J_N$ 344 with gate contacts $G_2$ 336, $G_3$ 340, $G_N$ 346 plus drain contact $D_N$ 348 form HFETs $Q_{3,2}$ 306, $Q_{4,3}$ 308, and $Q_{D,N}$ 310.

The example HFETs depicted in FIG. 3 are also known as high electron mobility transistors (HEMTs). In the HEMTs of FIG. 3, the second active layer 352, which generally has a higher bandgap than the first active layer 356, gives rise to a layer of electric charge 354 in the first active layer 356 near the second active layer 352. The layer of electric charge 354 defines a lateral conductive channel. The first active layer 356 is sometimes called the channel layer. The second active layer 352 is sometimes called the barrier layer or the donor layer. The layer of electric charge 354 which defines the lateral conductive channel is sometimes called a two-dimensional electron gas (2DEG) because electrons, trapped in the quantum well that results from the difference in the bandgaps, are free to move in two dimensions but are tightly confined in the third dimension.

In the operation of an HFET, for example $Q_{1,0}$, electric charge in the two-dimensional electron gas 354 moves in a channel between the source contact $S_0$ 326 and the drain contact $J_1$ 330 to become a current in an external circuit. The electric charge, and hence the current, is controlled by a voltage from an external circuit that is electrically connected between the gate contact $G_0$ 328 and the source contact $S_0$ 326.

The example static discharge structure of FIG. 3 shows electrical connections between source, gate, and junction contacts. As used in this disclosure, an electrical connection is an ohmic connection. An ohmic connection is one in which the relationship between the voltage and the current is linear and symmetric for both directions of the current. For example, two metal patterns that contact each through only metal are electrically connected. In contrast, the junction contact $J_1$ 330 and the source contact $S_0$ 330 are not electrically connected in the example of FIG. 3 because any connection between these contacts is through a channel in the semiconductor and controlled by the gate contact $G_0$ 328. Similarly, the gate contact $G_0$ 328 is not electrically connected to the semiconductor 352 under the gate contact $G_0$ 328, and the gate contact $G_0$ 328 is not electrically connected to the 2DEG 354 when a gate dielectric 350 is used to insulate the gate contact $G_0$ 328 from the semiconductor 352 beneath.

A passivation layer 312 of a dielectric material is disposed around the contacts and above the gate dielectric layer 312 in the example of FIG. 3. The passivation layer 312 provides stability of the electrical characteristics of the device by isolating the surface of the device from electrical and chemical contaminants in the environment. The passivation layer 312 may be deposited in more than one step to allow for metal to be embedded within the passivation material.

In other examples that use different arrangements of passivation layers, the gate dielectric layer 350 is optional. In examples without the gate dielectric layer 350, the gate contacts $G_0$ 328, $G_1$ 332, $G_2$ 336, $G_3$ 340, and $G_N$ 346 each form a Schottky contact to the second active layer 352. A Schottky contact is a junction between a metal and a semiconductor that conducts current between the metal and the semiconductor in only one direction. Transistors without the gate dielectric layer are sometimes called Schottky gate transistors. An example of a construction that uses an optional gate dielectric layer is presented later in this disclosure.

The passivation 312 in the example of FIG. 3 is transparent, giving visibility to objects that lie behind the plane of the cross-section. For example, the metal 322 that makes an electrical connection between junction contact $J_1$ 330 and gate contact $G_2$ 336 is in a plane behind metal 314 and metal 316. Metal 324 is behind metal 316 and metal 318. The metal 318 that makes an electrical connection to junction contact $J_4$ 342 would make an electrical connection with a gate $G_5$ not shown in the example of FIG. 3. The metal 320 that makes an electrical connection to the gate contact $G_N$ 346 would make an electrical connection with a junction contact $J_{(N-1)}$ not shown in the example of FIG. 3.

Figure 4:
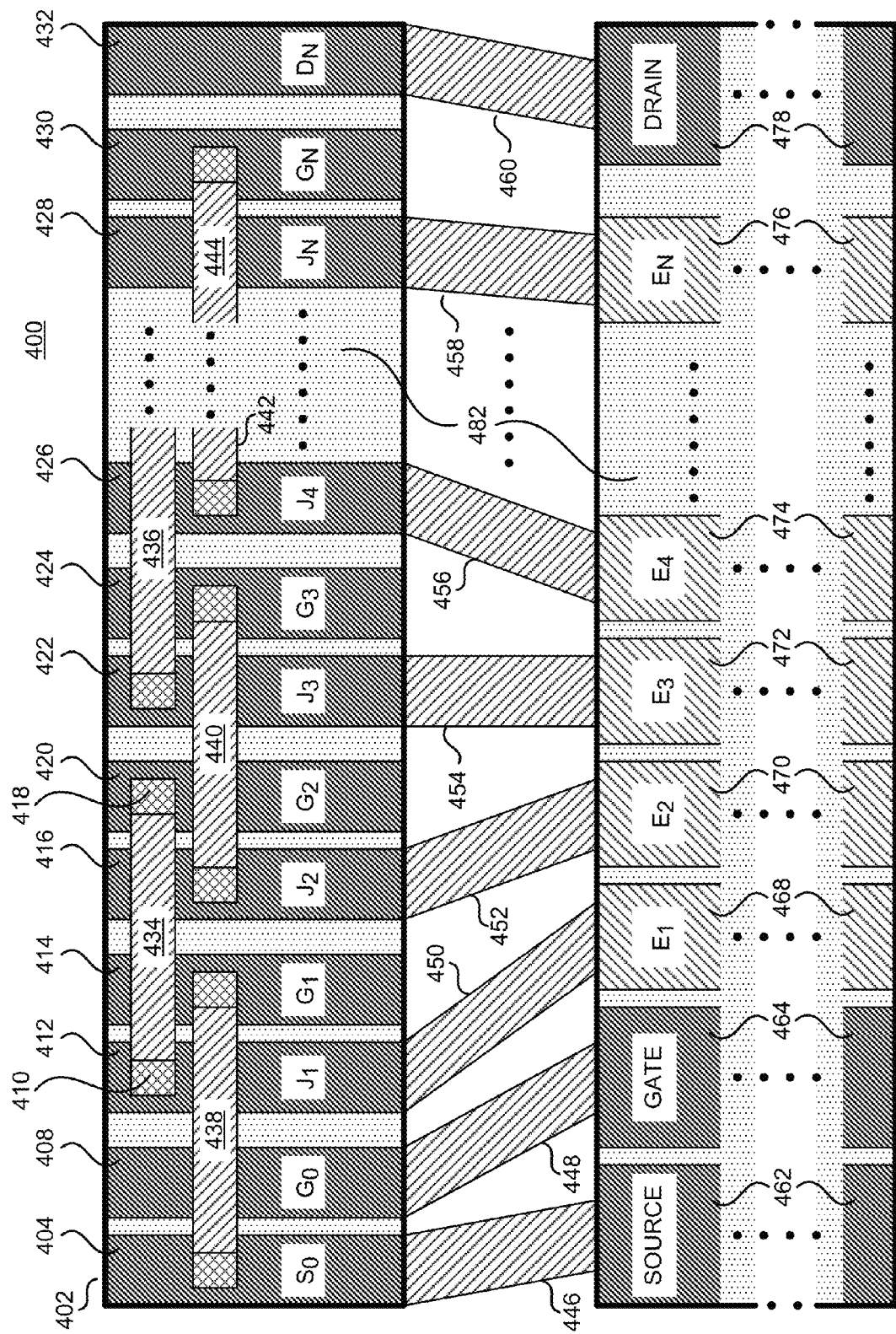
FIG. 4 is a top view of a semiconductor structure that shows transistors of an example static discharge system and a portion of an example high voltage power HFET with an example charge distribution structure.

FIG. 4 is a top view 400 that shows the example static discharge system of FIG. 3 with a high voltage power HFET 480. The static discharge system 402 and the high voltage power HFET 480 in the example of FIG. 4 may be fabricated as separate devices on the same semiconductor substrate as will be described in detail later in this disclosure. The passivation material in the example static discharge system of FIG. 3 is transparent in the view of FIG. 4, providing visibility to the gate dielectric 482 and to various conductive components. The elements of FIG. 4 are not shown to scale.

The high voltage power HFET 480 in the example of FIG. 4 has a significant section of its interior removed to emphasize that the high voltage power HFET 480 is typically substantially larger than the static discharge system 402. In practice, the width of the conducting channel of each transistor in the static discharge system 402 may be less than 2% of the width of conducting channel in the high voltage power HFET 480. The transistors in the static discharge system 402 must be only large enough to conduct the accumulated charge from the components of the charge distribution structure during the transitions in voltage on the high voltage power HFET 480. The high voltage power HFET 480 includes a source contact 462, a gate contact 464, a drain contact 478, and a charge distribution structure with conductive components $E_1$ 468, $E_2$ 470, $E_3$ 472, $E_4$ 474, and $E_N$ 476.

The top view of the example static discharge system 402 shown in FIG. 4 reveals the layout of the metal that makes electrical connections between contacts of the low voltage HFETs. The example of FIG. 4 shows metal 438 connecting source contact $S_0$ 404 to gate contact $G_1$ 414, metal 434 connecting junction contact $J_1$ 412 to gate contact $G_2$ 418, and metal 440 connecting junction contact $J_2$ 416 to gate contact $G_3$ 424. Metal 436 would connect junction contact $J_3$ 422 to gate contact $G_4$ not shown in FIG. 4. Metal 442 would connect junction contact $J_4$ 426 to gate contact $G_5$ not shown in FIG. 4. Metal 444 would connect gate contact $G_N$ 430 to junction contact $J_{(N-1)}$ not shown in FIG. 4.

The horizontal sections of the metal 434, 436, 438, 440, and 444 of the static discharge structure shown in FIG. 4 connect at their ends to vertical sections of metal not visible in FIG. 4. The vertical sections of metal connect to the contacts directly below the ends of the horizontal sections of metal. For example, horizontal metal section 434 connects to a vertical metal section 410 at one end that in turn connects to junction contact $J_1$ 412, and horizontal metal section 434 connects to a vertical metal section 418 at its other end that in turn connects to gate contact $G_2$ 420.

The example of FIG. 4 also shows connections between the static discharge system 402 and the high voltage HFET 480. Metal 446 connects the source contact $S_0$ 404 of the static discharge system 402 to the source contact 462 of the high voltage HFET 480. Metal 448 connects the gate contact $G_0$ 408 of the static discharge system 402 to gate contact 464 of the high voltage HFET 480. Metal 450 connects the junction contact $J_1$ 412 of the static discharge system 402 to the conductive component $E_1$ 468 of the charge distribution structure of the high voltage HFET 480. Metal 452 connects the junction contact $J_2$ 416 and to conductive component $E_2$ 470 of the charge distribution structure of the high voltage HFET 480. Metal 454 connects the junction contact $J_3$ 422 to the conductive component $E_3$ 472 of the charge distribution structure of the high voltage HFET 480. Metal 456 connects the junction contact $J_4$ 426 to the conductive component $E_4$ 474 of the charge distribution structure of the high voltage HFET 480. Metal 458 connects the junction contact $J_N$ 428 to the conductive component $E_N$ of the charge distribution structure of the high voltage HFET 480. Metal 460 connects the drain contact $D_N$ 432 to the drain contact 478 of the high voltage HFET 480.

Figure 5A:
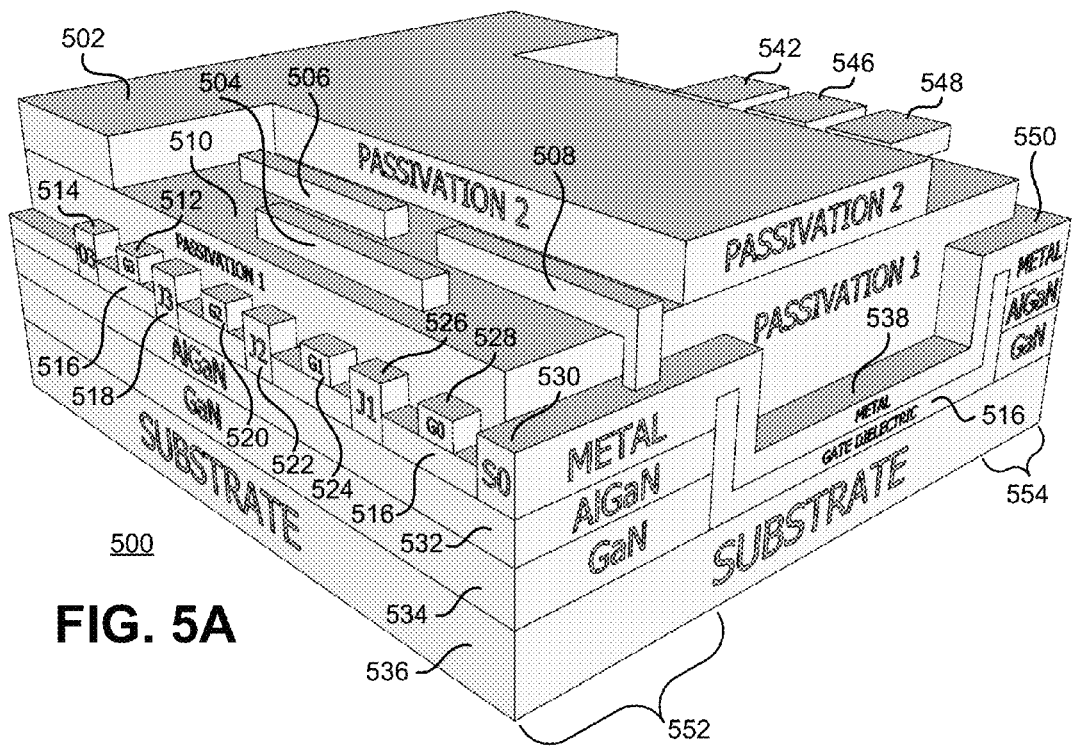
FIG. 5A is an illustration in a perspective view that shows relative positions of various parts and features of an example semiconductor device that includes a static discharge system and a portion of a power HFET in accordance with the teachings of the present invention.
Figure 5B:
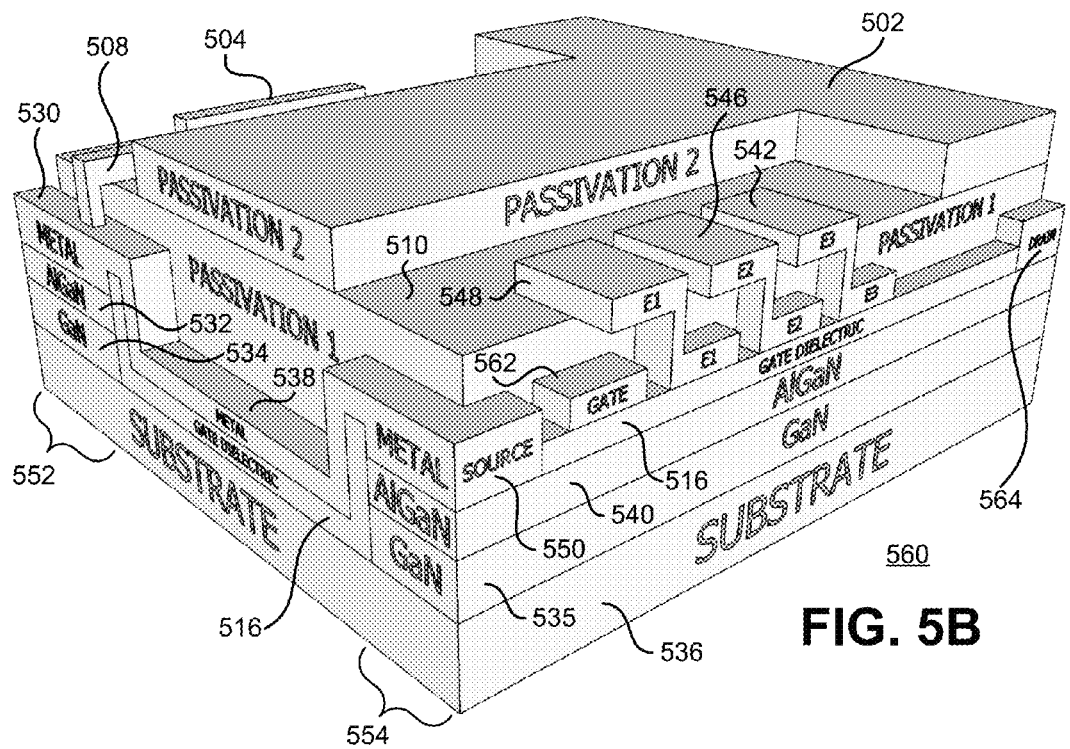
FIG. 5B is an illustration in a different perspective view of the example semiconductor device in FIG. 5A illustrating the relative positions of other parts and features not visible in the view of FIG. 5A.

FIG. 5A is a perspective view 500 showing the relative positions of various parts and features of an example static discharge system including a high voltage power HFET that has a charge distribution structure in accordance with the teachings of the present invention. FIG. 5B is a different perspective view 560 of the static discharge system shown in FIG. 5A. The example semiconductor device shown in FIG. 5A and FIG. 5B is similar to the example device described the in the cross-section view of FIG. 3 and in the top view of FIG. 4, and is represented in the electrical schematic diagram of FIG. 1

The perspective views of FIG. 5A and FIG. 5B, and all other perspective views presented in this disclosure may not be drawn to scale. Some dimensions may have been exaggerated to show details that would not be visible in a scaled drawing.

FIG. 5A and FIG. 5B illustrate how a static discharge system may be assembled with a high voltage HFET on the same substrate. Low voltage HFETs for the static discharge system may be fabricated with the same process and at the same time as the high voltage HFET. The static discharge system and the high voltage HFET may be fabricated as independent devices that are electrically coupled only through conductors that span the distance between the devices on the substrate.

Metal that connects contacts of the low voltage transistors and that connects the low voltage transistors to the charge distribution structure of the high voltage HFET may deposited at the same time as the metal that forms the charge distribution structure of the high voltage HFET. Portions of some layers of the example device have been removed in FIG. 5A and FIG. 5B to expose underlying features in greater detail. All layers would normally cover the entire device, ending at the same vertical plane on each side of the device.

FIG. 5A and FIG. 5B show the structures of an example static discharge system 552 and a portion 554 of a high voltage HFET. The example static discharge system 552 and the portion of the high voltage HFET 554 are on the same substrate 536, but they have independent active areas. The active areas are the regions of the active layers under the contacts that take part in the operation of the devices. The portion of the HFET 554 visible in the perspective drawings of FIG. 5A and FIG. 5B may represent typically less than 2% of the high voltage transistor.

In the example illustrated in FIG. 5A and FIG. 5B, the first active layer 534 of the static discharge system 552 and the first active layer 535 of the high voltage HFET 554 are of the same material composition, but the two first active layers are spatially separated from each other by a region where there is no first active layer. Also in the example illustrated in FIG. 5A and FIG. 5B, the second active layer 532 of the static discharge system 552 and the second active layer 540 of the high voltage HFET 554 are of the same material composition, but the two second active layers are spatially separated from each other by a region where there is no second active layer. Therefore, the transistors of the static discharge system 552 may operate independently from the high voltage HFET 554 even though all the devices are fabricated on the same substrate 536.

Consistent with the cross-section representation of FIG. 3 and the top view of FIG. 4, the perspective views of FIG. 5A and FIG. 5B show for the static discharge system a first active layer 534, a second active layer 532, and a dielectric layer 516 above a substrate 536. FIG. 5A and FIG. 5B also show for the high voltage HFET 554 a first active layer 535, a second active layer 540, and the dielectric layer 516 above the substrate 536. In the example of FIG. 5A and FIG. 5B, the dielectric layer 516 is continuous over the area of the static discharge system 552, the high voltage HFET 554, and the region where there are no active layers. FIG. 5A and FIG. 5B show conductive contacts for sources, gates, and drains of four low voltage HFETs and one high voltage HFET.

The example of FIG. 5A and FIG. 5B shows the gate dielectric 516 deposited over the second active layer 532 in the region of the static discharge system 552 and over the second active layer 540 in the region of the high voltage HFET 554. The gate dielectric layer 516 visible in FIG. 5A in the region of the static discharge system 552 corresponds to the region 350 in the cross-sectional view of the example of FIG. 3. The passivation 312 shown in the example cross-sectional view of the example of FIG. 3 corresponds to a first passivation layer 510 and a second passivation layer 502 in the example of FIG. 5A and FIG. 5B to indicate that the example the passivation is deposited in two steps of the fabrication process.

Contacts for terminals of the high voltage HFET 554 are visible in the perspective view of FIG. 5B as the source 550, the gate 562, and the drain 564. The perspective views of FIG. 5A and FIG. 5B also show conductive components $E_1$ 548, $E_2$ 546 and $E_3$ 542 of a charge distribution structure within the region of high voltage HFET 554. The conductive components $E_1$ 548, $E_2$ 456, and $E_N$ 542 may be formed from an electrically conducting material or materials such as one or more metals, heavily doped semiconductors, and the like.

Horizontal components of the charge distribution structure are fabricated from conductive material of appropriate thickness, appearing as stripes in a conventional two-dimensional view from the top. In one example, the thickness of the stripes may be approximately the same dimension as the width of the stripes. While the examples discussed herein refer to the horizontal components as stripes, more generally the horizontal components may be elongate members having a wide variety of different cross-sectional shapes.

FIG. 5A and FIG. 5B reveal that the conductive components $E_1$ 548, $E_2$ 546 and $E_3$ 542 of the charge distribution structure are formed from horizontal top stripes and horizontal bottom stripes that are connected with vertical conducting pillars through the first passivation layer 510. Contacts for terminals of low voltage HFETs in the region of the static discharge structure 552 are visible in the perspective view of FIG. 5A as source contact $S_0$ 530, drain contact $D_3$ 514, junction contacts $J_1$ 526, $J_2$ 522, $J_3$ 518, and gate contacts $G_0$ 528, $G_1$ 524, $G_2$ 520, and $G_3$ 512.

The contacts of the transistors in the example illustrated in the perspective views of FIG. 5A and FIG. 5B are connected with deposits of metal. For example, the metal 504 connects junction contact $J_1$ 526 to gate contact $G_2$ 520. The metal 506 connects junction contact $J_2$ 522 to gate contact $G_3$ 512. The metal 508 connects gate contact $G_1$ 524 to source contact $S_0$ 530. The metal 538 connects source contact $S_0$ 530 of the static discharge system 552 to source contact 550 of the high voltage HFET 554. The first passivation layer 510 and the second passivation layer 502 are removed in the perspective views of FIG. 6A and FIG. 6B to reveal more of the metal in the examples of FIG. 5A and FIG. 5B.

Figure 6A:
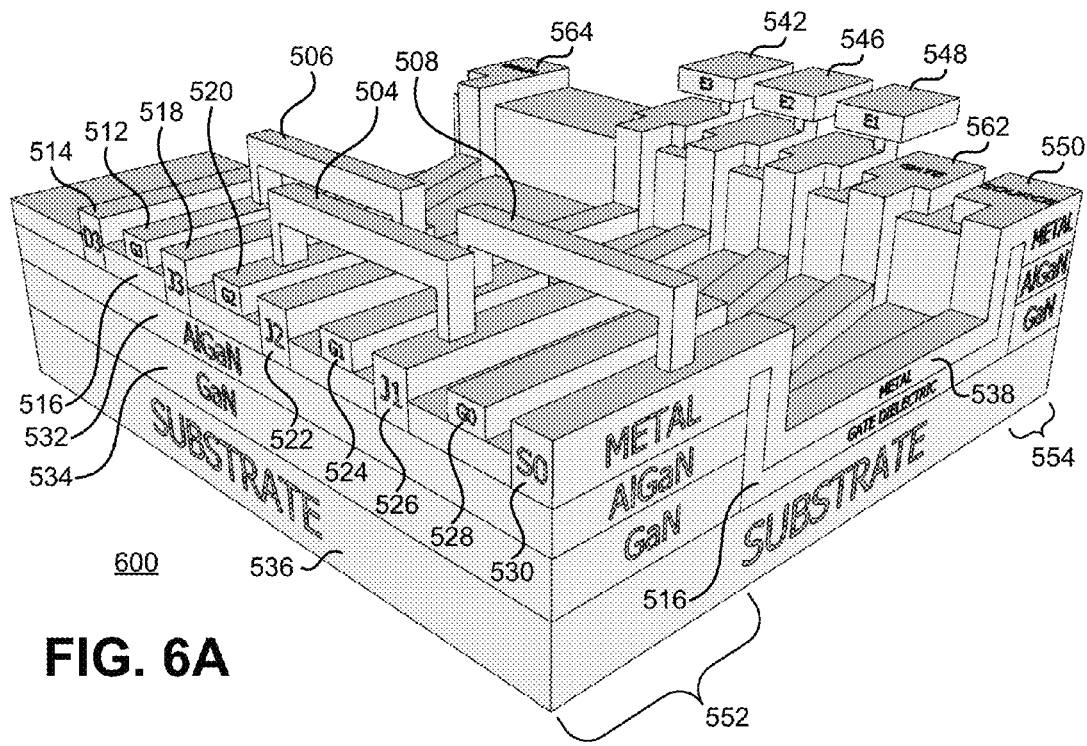
FIG. 6A is an illustration in perspective view of the example semiconductor device in FIG. 5A with passivation removed to reveal metal that is not visible in the illustration of FIG. 5A.
Figure 6B:
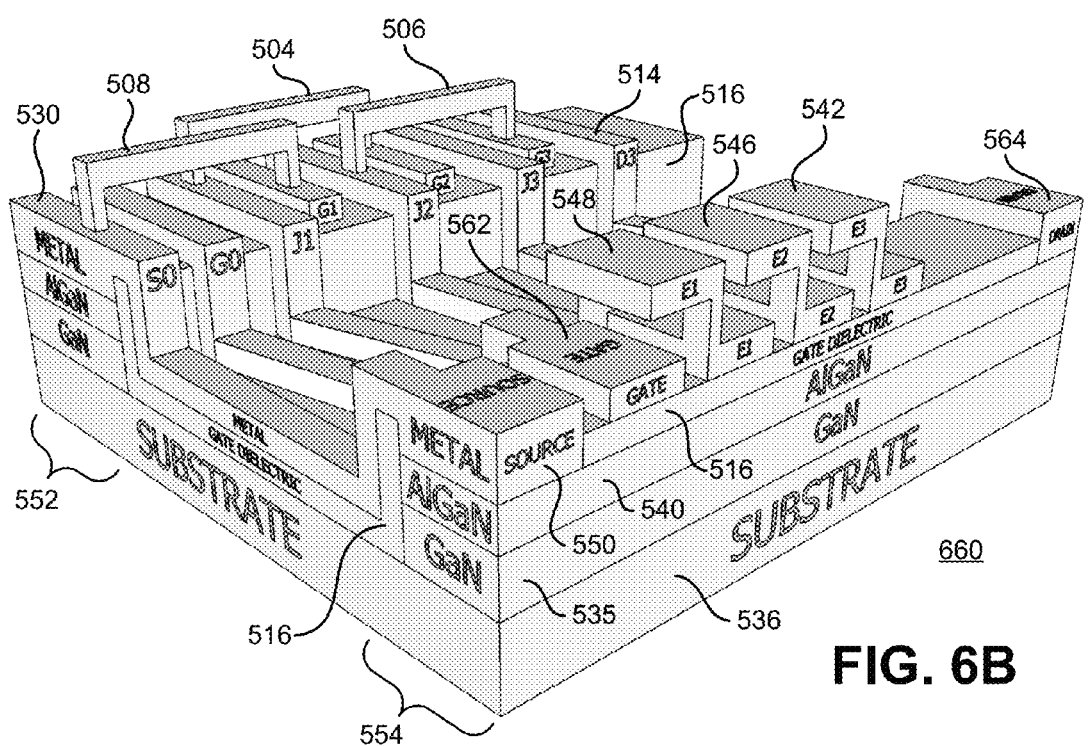
FIG. 6B is an illustration in a different perspective view of the example semiconductor device in FIG. 5B illustrating the relative positions of other parts and features not visible in the view of FIG. 5B.

FIG. 6A is a perspective view 600 that shows the example static discharge system of FIG. 5A with passivation layers 510 and 502 removed to show additional detail. FIG. 6B is a different perspective view 660 of the example static discharge system shown in FIG. 6A. FIG. 6A and FIG. 6B reveal the conductors under the passivation and above the gate dielectric 516 that occupies the space between the region of the static discharge system 552 and the high voltage HFET 554 on the substrate 536.

Figure 7:
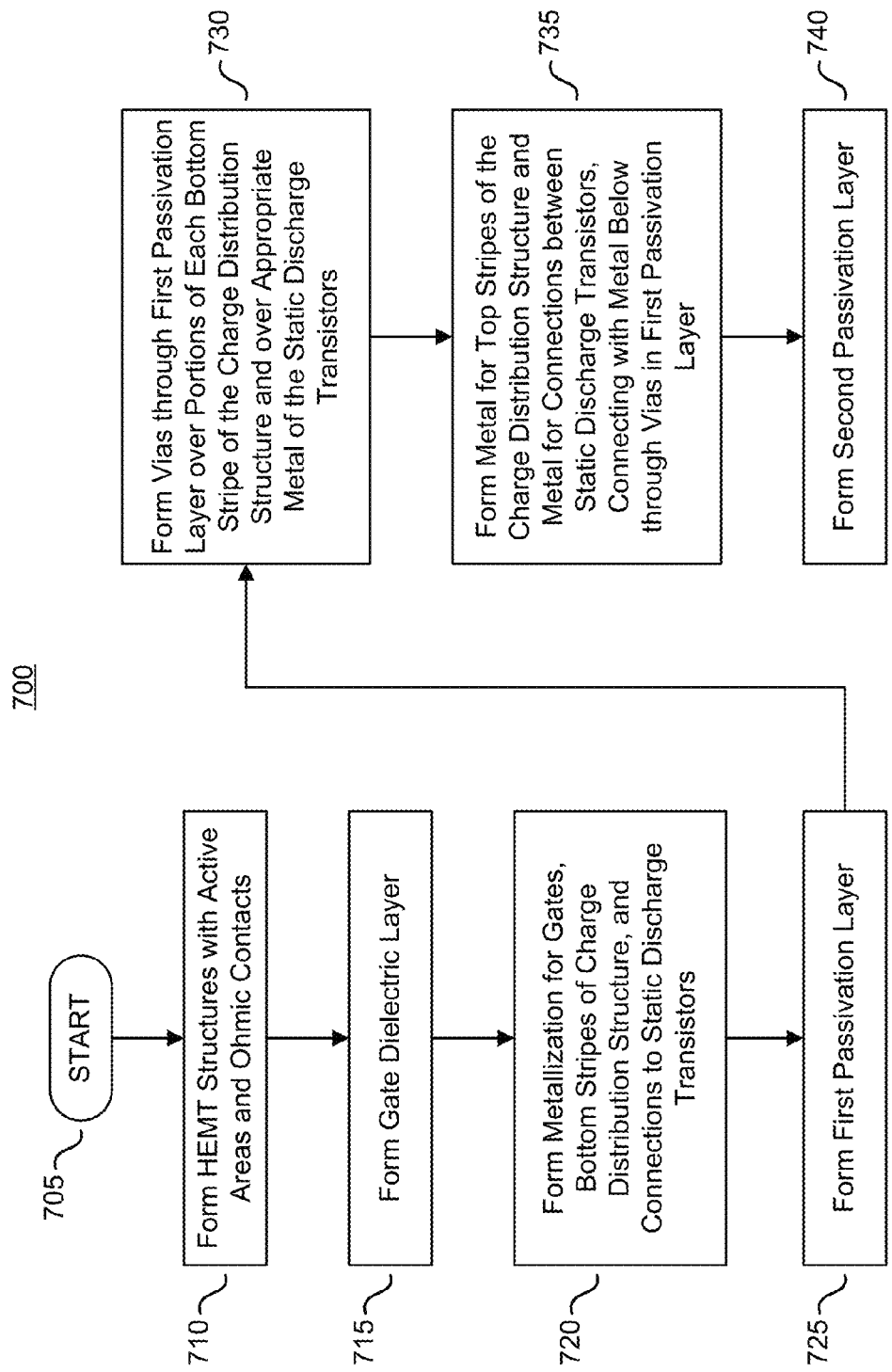
FIG. 7 is an example flow diagram illustrating generally a sample flow of operations in a process to construct the example semiconductor device illustrated in FIG. 5A and FIG. 5B that includes a static discharge system in accordance with the teachings of the present invention.

FIG. 7 is an example flow diagram illustrating generally a sample flow of operations in an example process to construct the example semiconductor device illustrated in FIG. 5A and FIG. 5B in accordance with the teachings of the present invention. After starting in block 705, structures for high electron mobility transistors (HEMTs) are formed in block 710 with active areas and ohmic contacts for the drains and the sources as is known in the art. A gate dielectric layer is then formed over the active areas in step 715.

After the gate dielectric layer is formed in block 715, metallization for the gates of the HEMTs, metallization for the bottom stripes of the charge distribution structure, and metallization for the connections between the high voltage HFET and the transistors of the static discharge system are formed over the gate dielectric layer in block 720. Next, in block 725, a first passivation layer is formed over the metal previously deposited.

Vias are then formed through the first passivation layer in block 730 where it is desired to join the bottom stripes with the top stripes to form components of the charge distribution structure. Vias are also formed over appropriate portions of the transistors in the static discharge system to provide connections between them as described above. Metal is then deposited in block 735 on the surface of the first passivation layer and through the vias in the first passivation layer to form top stripes of the charge distribution structure that are joined to bottom stripes of the charge distribution structure. Metal is also deposited on the surface of the first passivation layer and through the vias in the first passivation layer to form connections between the static discharge transistors. The process ends with the formation of a second passivation layer in block 740.

Figure 8A:
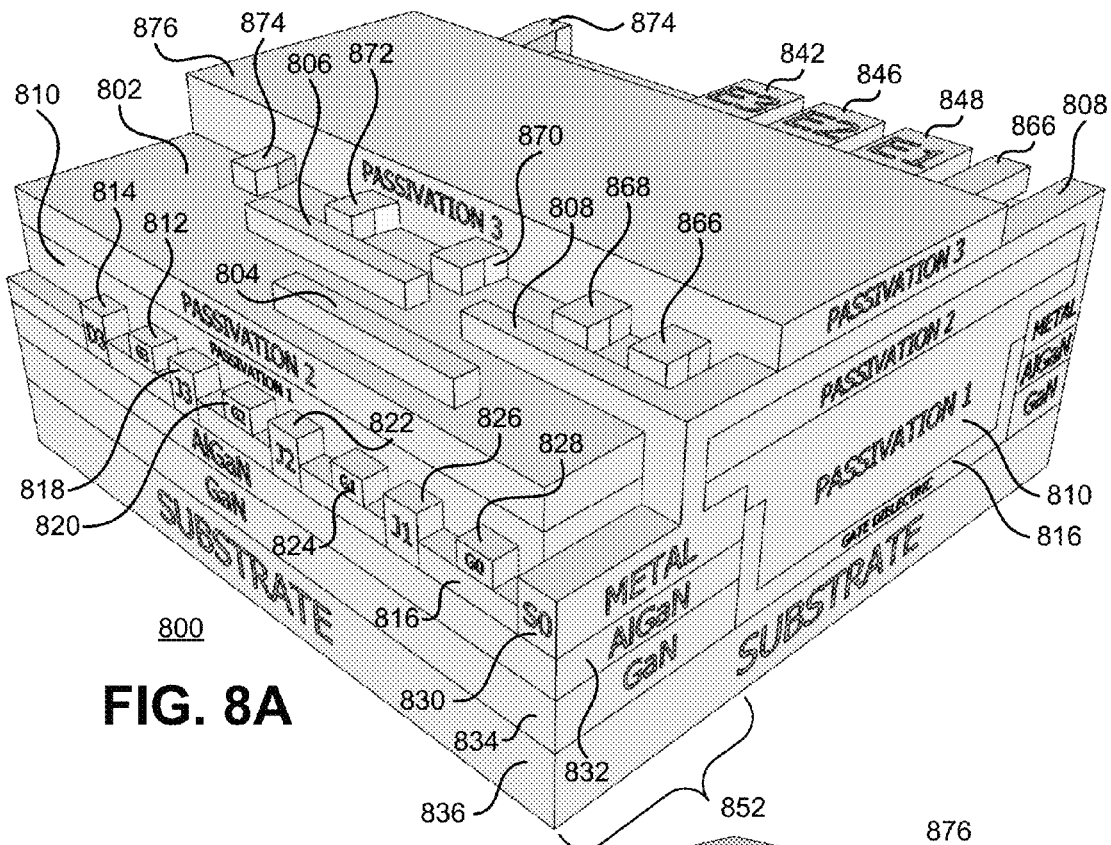
FIG. 8A is an illustration in a perspective view that shows relative positions of various parts and features of another example semiconductor device that includes a static discharge system and a portion of a power HFET in accordance with the teachings of the present invention.
Figure 8B:
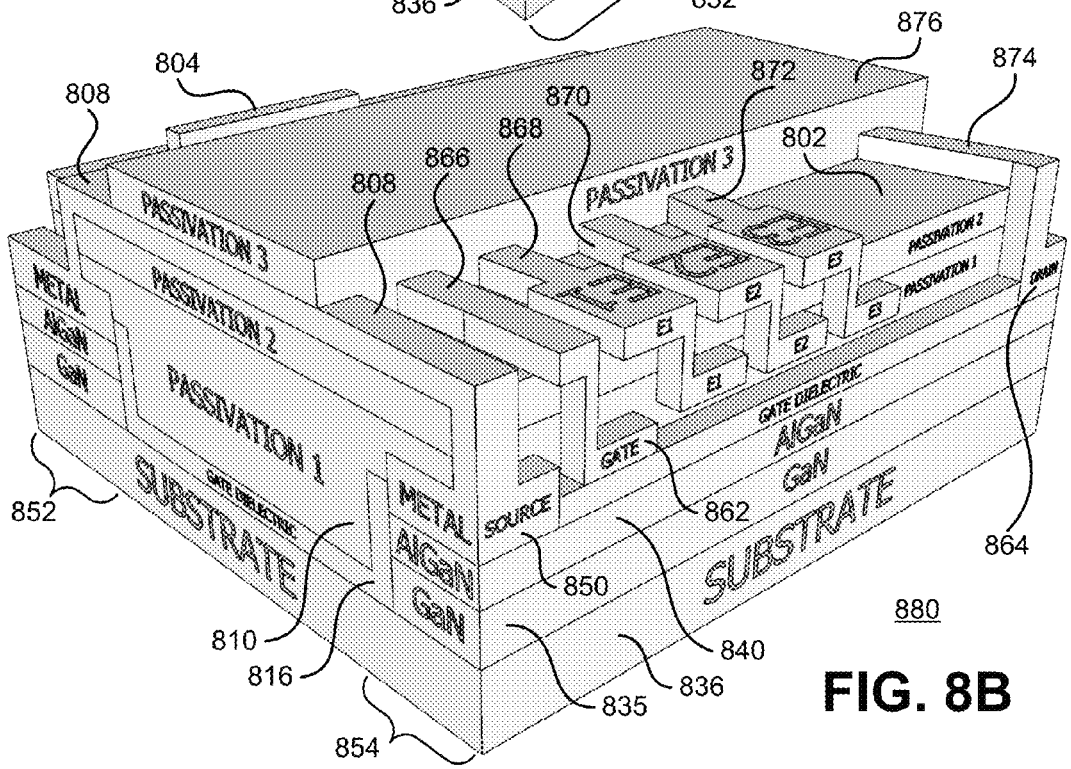
FIG. 8B is an illustration in a different perspective view of the example semiconductor device in FIG. 8A illustrating the relative positions of other parts and features not visible in the view of FIG. 8A.

FIG. 8A is a perspective view 800 showing the relative positions of various parts and features of another example static discharge system 852 sharing a substrate 836 with a high voltage HFET 854 (see FIG. 8B) that includes a charge distribution structure in accordance with the teachings of the present invention. FIG. 8B is a different perspective view 880 of the device shown in FIG. 8A. The example static discharge system 852 shown in FIG. 8A and FIG. 8B has an additional layer of passivation 810 that allows an optional gate dielectric layer 816, whereas the gate dielectric layer 516 is mandatory in the structure illustrated in FIG. 5A, FIG. 5B, FIG. 6A, and FIG. 6B. In examples without the optional gate dielectric layer 816, the gate contact 862 forms a Schottky contact to the second active layer 840, and the passivation layer 810 insulates the components $E_1$ 868, $E_2$ 870, and $E_3$ 872 of the charge distribution structure from the second active layer 840.

FIG. 8A and FIG. 8B illustrate how a static discharge system 852 may be assembled on the same substrate as a high voltage HFET 854 during the fabrication of the HFET 854 in accordance with the teachings of the present invention. As in FIG. 5A and FIG. 5B, portions of some layers of the example device have been removed in FIG. 8A and FIG. 8B to expose underlying features in greater detail.

Similar to the views of FIG. 5A and FIG. 5B, the perspective views of FIG. 8A and FIG. 8B show a static discharge system 852 and a portion of a high voltage HFET 854. The perspective views of FIG. 8A and FIG. 8B show for the static discharge system 852 a first active layer 834, a second active layer 832, and an optional dielectric layer 816 above a substrate 836. FIG. 8A and FIG. 8B also show for the high voltage HFET 854 a first active layer 835, a second active layer 840, and the optional dielectric layer 816 above the substrate 836. FIG. 8A and FIG. 8B show that the two active areas of the static discharge system 852 are spatially separated from the two active areas of the high voltage HFET 854 by a region where there are no active layers.

In the example of FIG. 8A and FIG. 8B, the optional dielectric layer 816 is continuous over the area of the static discharge system 852, the high voltage HFET 854, and the region where there are no active layers. FIG. 8A and FIG. 8B show conductive contacts for sources, gates, and drains of four low voltage HFETs and one high voltage HFET as illustrated in the schematic diagram of FIG. 1.

The example of FIG. 8A shows the optional gate dielectric 816 deposited over the second active layer 832 in the region of the static discharge system 852, and FIG. 8B shows the optional gate dielectric 816 deposited over the second active layer 840 in the region of the high voltage HFET 854. The example of FIG. 8A and FIG. 8B also shows a first passivation layer 810, a second passivation layer 802, and a third passivation layer 876 deposited over the optional gate dielectric 816. In examples that do not use the gate dielectric 816, gate contact 862 is deposited directly on the second active layer 840 to form a Schottky contact.

Contacts for terminals of the high voltage HFET 854 are visible in the perspective view of FIG. 8B as the source 850, the gate 862, and the drain 864. The perspective views of FIG. 8A and FIG. 8B also show conductive components $E_1$ 848, $E_2$ 846 and $E_3$ 842 of a charge distribution structure within the region of high voltage HFET 854. The conductive components $E_1$ 848, $E_2$ 846, and $E_N$ 842 may be formed from an electrically conducting material or materials such as one or more metals, heavily doped semiconductors, and the like.

FIG. 8A and FIG. 8B reveal that the conductive components $E_1$ 848, $E_2$ 846 and $E_3$ 842 of the charge distribution structure are formed from horizontal top stripes and horizontal bottom stripes above and below passivation layer 802, respectively. Contacts for terminals of low voltage HFETs in the region of the static discharge structure 852 are visible in the perspective view of FIG. 8A as source contact $S_0$ 830, drain contact $D_3$ 814, junction contacts $J_1$ 826, $J_2$ 822, $J_3$ 818, and gate contacts $G_0$ 828, $G_1$ 824, $G_2$ 820, and $G_3$ 812.

The contacts of the transistors in the example illustrated in the perspective views of FIG. 8A and FIG. 8B are connected with deposits of metal. For example, the metal 804 connects junction contact $J_1$ 826 to gate contact $G_2$ 820. The metal 806 connects junction contact $J_2$ 822 to gate contact $G_3$ 812. The metal 808 connects gate contact $G_1$ 824 to source contact $S_0$ 830. The metal 808 also connects source contact $S_0$ 830 of the static discharge system 852 to source contact 850 of the high voltage HFET 854.

The metal 874 connects drain contact $D_3$ 814 of the static discharge system 852 to drain contact 864 of the high voltage HFET 854. The metal 872 connects junction contact $J_3$ 818 of the static discharge system 852 to conductive component $E_3$ 842 of the high voltage HFET 854. The metal 870 connects junction contact $J_2$ 822 of the static discharge system 852 to conductive component $E_2$ 846 of the high voltage HFET 854. The metal 868 connects junction contact $J_1$ 826 of the static discharge system 852 to conductive component $E_1$ 848 of the high voltage HFET 854. The metal 866 connects gate contact $G_0$ 828 of the static discharge system 852 to the gate 862 of the high voltage HFET 854.

Figure 9A:
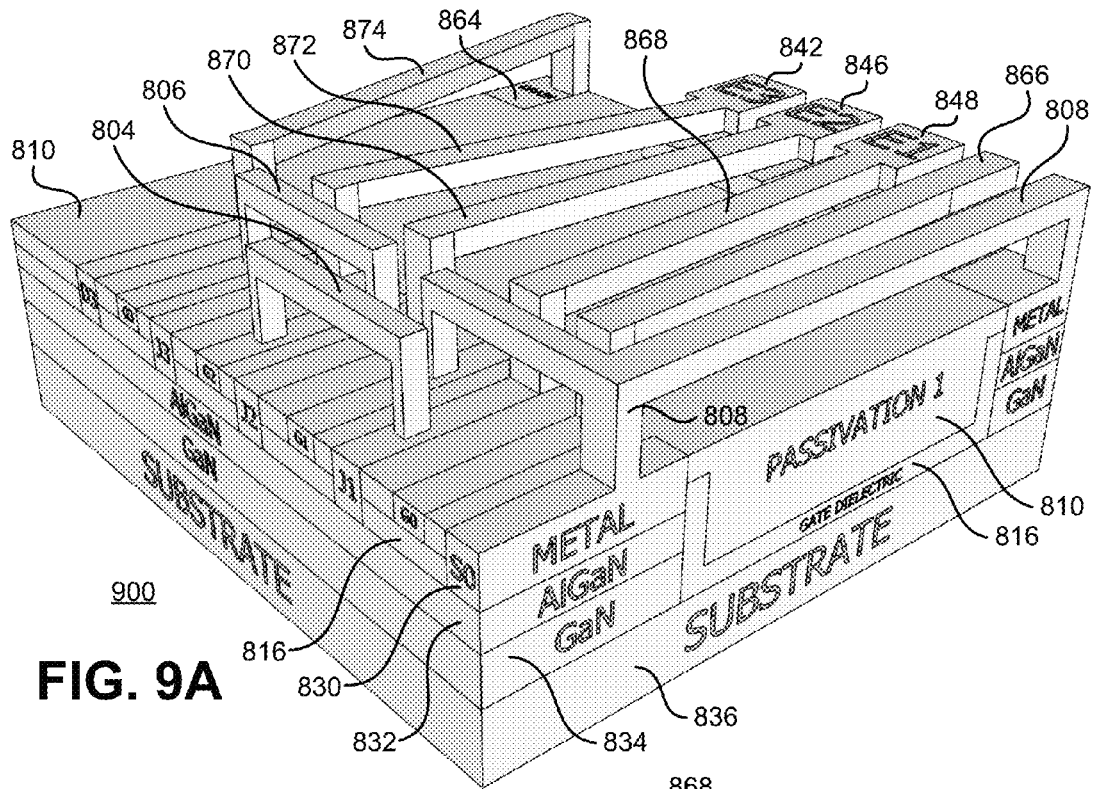
FIG. 9A is an illustration in perspective view of the example semiconductor device in FIG. 8A with passivation removed to reveal metal that is not visible in the illustration of FIG. 8A.
Figure 9B:
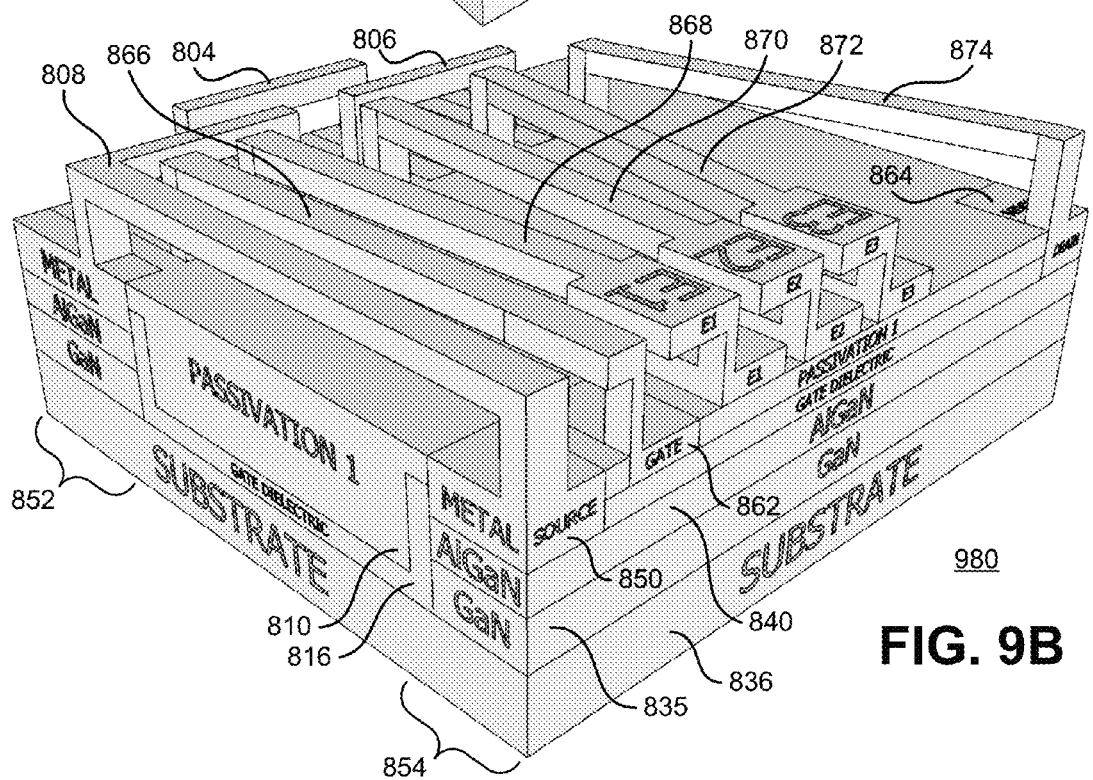
FIG. 9B is an illustration in a different perspective view of the example semiconductor device in FIG. 8B illustrating the relative positions of other parts and features not visible in the view of FIG. 8B.

FIG. 9A is a perspective view 900 that shows the example static discharge system of FIG. 8A with passivation layers 802 and 876 removed to show additional detail. FIG. 9B is a different perspective view 980 of the example static discharge system shown in FIG. 9A. FIG. 9A and FIG. 9B reveal the metal above the first passivation layer 810.

Figure 10:
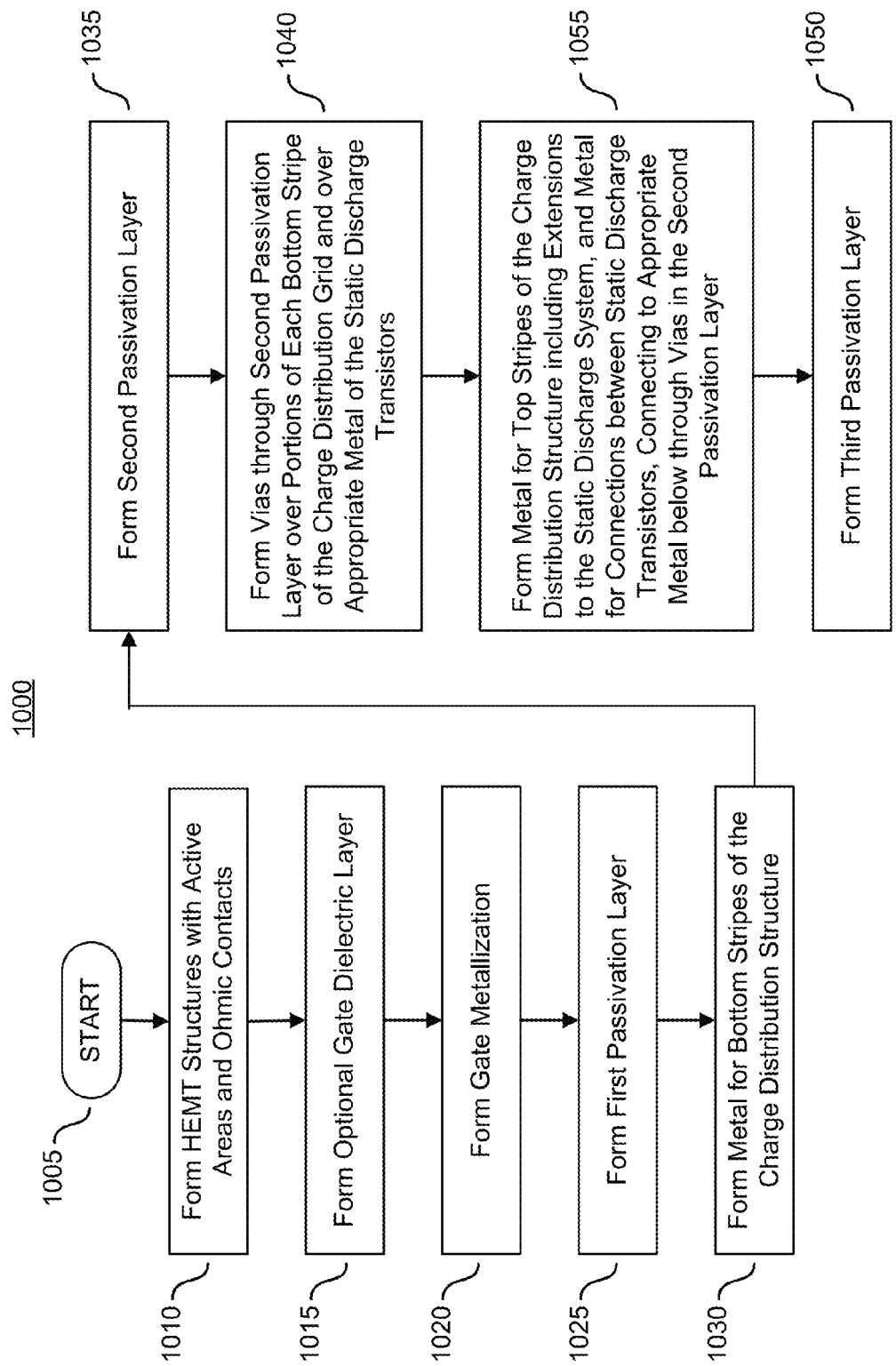
FIG. 10 is an example flow diagram illustrating generally a sample flow of operations in a process to construct the example semiconductor device illustrated in FIG. 8A and FIG. 8B that includes a static discharge system and a portion of a power HFET in accordance with the teachings of the present invention.

FIG. 10 is an example flow diagram illustrating generally a sample flow of operations in an example process to construct the example semiconductor device illustrated in FIG. 8A, FIG. 8B, FIG. 9A, and FIG. 9B in accordance with the teachings of the present invention. After starting in block 1005, structures for high electron mobility transistors (HEMTs) are formed in block 1010 with active areas and ohmic contacts for the drain and the source as is known in the art. An optional gate dielectric layer may then be formed over the active area in block 1015. Block 1015 is skipped in examples that do not use the optional gate dielectric layer.

After the completion of the operation in block 1015 in examples that use the optional gate dielectric layer, metallization for the gates is then formed in block 1020. Next, a first passivation layer is formed over the metal for the gates and the contacts for the drains and sources in block 1025. The formation of the first passivation layer may include removal of passivation material to form channels for the bottom stripes of the charge distribution structure. Then in block 1030 metal is deposited for the bottom stripes of the charge distribution structure, followed by a second passivation layer in block 1035.

Vias are then formed through the second passivation layer in block 1040 where it is desired to join the bottom stripes with top stripes to form components of the charge distribution structure and to make connections to the contacts of the static discharge structure. Metal is then deposited in block 1055 on the surface of the second passivation layer and through the vias in the second passivation layer to form top stripes of the charge distribution structure that are joined to bottom stripes of the charge distribution structure, and to form conductors that connect contacts of the static discharge system to contacts of the high voltage HFET. The process ends with the formation of a third passivation layer in block 1050.

While the teachings of the present invention have been described above in the context of an HFET, these teachings may be used with other semiconductor devices as well. For example, the surface charge distribution structure of the present invention may be used with an inverted HFET, which is similar to an HFET except that the donor layer is formed below the channel layer instead of above the channel layer as in an HFET.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A semiconductor circuit, comprising:
   a three-terminal high voltage semiconductor device;
   a charge distribution structure having a plurality of conductors with a floating potential, said charge distribution structure being capacitively coupled to a first terminal of the semiconductor device; and
   a static discharge system removing charge that accumulates on at least a subset of the conductors, said static discharge system removing the charge that accumulates on the subset of conductors when the semiconductor device is in a first state while allowing charge to accumulate on the subset of conductors when the semiconductor device is in a second state.

2. The semiconductor circuit of claim 1 wherein the semiconductor device is a HFET.

3. The semiconductor circuit of claim 2 wherein the HFET is a depletion-mode HFET.

4. The semiconductor circuit of claim 1 wherein the plurality of conductors includes a first conductor capacitively coupled to a gate of the semiconductor device and a second conductor capacitively coupled to the first conductor.

5. The semiconductor circuit of claim 1 wherein the static discharge system includes a plurality of transistors coupled between the gate and a drain of the semiconductor device.

6. The semiconductor circuit of claim 5 wherein a source of a first of the transistors is electrically coupled to a gate of the second of the transistors and a drain of the first transistor is electrically coupled to a gate of a third of the transistors, the source of the first transistor being electrically coupled to a source of the semiconductor device and a gate of the first transistor being electrically coupled to a gate of the semiconductor device.

7. The semiconductor circuit of claim 5 wherein each of the plurality of transistors is arranged to be in an off-state when the semiconductor device is in an off-state and in an on-state when the semiconductor device is in the on-state.

8. The semiconductor circuit of claim 5 further comprising a first junction, wherein a first of the conductors, a drain of a first of the transistors, a source of a second of the transistors and a gate of a third of the transistors are all electrically coupled to the first junction.

9. The semiconductor circuit of claim 5 wherein each of the transistors is configured to have a lower breakdown voltage than a breakdown voltage of the HFET.

10. The semiconductor circuit of claim 5 wherein the source of a transistor in the plurality of transistors in the static discharge system is coupled to a first conductor of the plurality of conductors of the charge distribution structure, the gate of the transistor being coupled to a second conductor of the plurality of conductors of the charge distribution structure, the electrical potential difference between the first conductor and the second conductor being sufficient to maintain the transistor in a second state when the semiconductor device is in the second state.

11. The semiconductor circuit of claim 5 wherein the charge distribution structure includes N conductors $E_1$, $E_2$, ... $E_N$, where N>1, the plurality of transistors including N+1 transistors $Q_1, Q_2, ... Q_{N+1}$ such that conductor $E_K$ is electrically coupled to a source of transistor $Q_{K+1}$, a gate of transistor $Q_{K+2}$ and a drain of transistor $Q_K$, where $1<K\le (N-1)$.

12. The semiconductor circuit of claim 1 wherein the semiconductor device and the plurality of transistors are formed on a common substrate.

13. The semiconductor circuit of claim 1 wherein the semiconductor device is a HFET and each of the plurality of transistors is a HFET.

14. The semiconductor circuit of claim 13 wherein each of the plurality of transistors is a depletion-mode HFET.

15. A semiconductor structure, comprising:
   a substrate having first and second active areas spatially separated from one another;
   a first active layer disposed on the first and second active areas of the substrate;
   a second active layer disposed on the first active layer such that a lateral conductive channel arises between the first active layer and the second active layer;

a source, gate and drain contact disposed over a first portion of the second active layer located on the first active area of the substrate to define a HFET;

a plurality of conductors disposed over the second active layer between the gate and drain contacts, a first of said conductors being capacitively coupled to the gate contact and a second of said conductors being capacitively coupled to the first conductor; and a series of contacts disposed over a second portion of the second active layer located on the second active area of the substrate to define a plurality of transistors such that one of the contacts is a junction contact that serves as a drain contact of a first of the transistors and a source contact of a second of the transistors, the plurality of transistors being electrically coupled to the HFET.

16. The semiconductor structure of claim 15 further comprising a first connector electrically connecting the junction contact to a gate contact of a third of the transistors, said first connector including a first elongate member and first vias.

17. The semiconductor structure of claim 16 further comprising a second and third connector electrically coupling the source contact and a gate contact of the first transistor to the source contact and the gate contact of the HFET, respectively.

18. The semiconductor structure of claim 17 further comprising a fourth connector electrically coupling the junction contact to a first of the conductors.

19. The semiconductor structure of claim 18 further comprising a dielectric layer disposed on a portion of the substrate located between the first and second active areas.

20. The semiconductor structure of claim 19 further comprising a metallization layer disposed over the dielectric layer, the metallization layer being patterned to define the second, third and fourth connectors.

21. The semiconductor structure of claim 18 further comprising a fifth connector electrically coupling a given one of the contacts defining a second junction contact to a second of the conductors, the second junction contact serving as a drain contact of the second of the transistors and a source contact of the third of the transistors.

22. The semiconductor structure of claim 15 further comprising a dielectric layer disposed between the second active layer and the plurality of conductors.

23. The semiconductor structure of claim 15 wherein each of the conductors includes first and second elongate members and a conductive via electrically coupling the first elongate member to the second elongate member.

24. The semiconductor structure of claim 14 wherein the plurality of transistors are electrically coupled to the HFET such that charge accumulates on the conductors when the HFET is in an off-state and is removed from the conductors when the HFET is in an on-state.

* * * * *